United States Patent
Kato et al.

(10) Patent No.: US 9,502,215 B2
(45) Date of Patent: Nov. 22, 2016

(54) PLASMA PROCESSING APPARATUS AND PLASMA PROCESSING METHOD

(71) Applicant: Tokyo Electron Limited, Tokyo (JP)

(72) Inventors: Hitoshi Kato, Iwate (JP); Shigehiro Miura, Iwate (JP); Chishio Koshimizu, Yamanashi (JP); Jun Yamawaku, Yamanashi (JP); Yohei Yamazawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 10 days.

(21) Appl. No.: 14/538,981

(22) Filed: Nov. 12, 2014

(65) Prior Publication Data

US 2015/0132505 A1    May 14, 2015

(30) Foreign Application Priority Data

Nov. 14, 2013   (JP) .................................. 2013-236013

(51) Int. Cl.
   *H01J 37/32*     (2006.01)
(52) U.S. Cl.
   CPC .......... *H01J 37/3211* (2013.01); *H01J 37/321* (2013.01); *H01J 37/32651* (2013.01)
(58) Field of Classification Search
   None
   See application file for complete search history.

(56) References Cited

U.S. PATENT DOCUMENTS

| | | | |
|---|---|---|---|
| 2004/0011467 A1* | 1/2004 | Hemker | H01J 37/32495 156/345.49 |
| 2004/0085246 A1* | 5/2004 | Howald | H01J 37/321 343/701 |
| 2008/0026162 A1* | 1/2008 | Dickey | C23C 16/452 427/569 |

FOREIGN PATENT DOCUMENTS

| | | |
|---|---|---|
| JP | 2003-022977 | 1/2003 |
| JP | 2011-119659 | 6/2011 |
| JP | 2013-045903 | 3/2013 |

* cited by examiner

*Primary Examiner* — Joseph Miller, Jr.
(74) *Attorney, Agent, or Firm* — IPUSA, PLLC

(57) ABSTRACT

A plasma processing apparatus is provided. According to the apparatus, a main antenna connected to a high frequency power source and an auxiliary antenna electrically insulated from main antenna is arranged. Moreover, projection areas when the main antenna and the auxiliary antenna are seen in a plan view are arranged so as not to overlap with each other. More specifically, the auxiliary antenna is arranged on a downstream side in a rotational direction of the turntable relative to the main antenna. Then, a first electromagnetic field is generated in the auxiliary antenna by way of an induction current flowing through the main antenna, and a second induction plasma is generated even in an area under the auxiliary antenna in addition to an area under the main antenna by resonating the auxiliary antenna.

11 Claims, 19 Drawing Sheets

PLASMA PROCESSING APPARATUS AND PLASMA PROCESSING METHOD

CROSS-REFERENCE TO RELATED APPLICATIONS

This patent application is based upon and claims the benefit of priority of Japanese Patent Application No. 2013-236013, filed on Nov. 14, 2013, the entire contents of which are incorporated herein by reference.

BACKGROUND OF THE INVENTION

1. Field of the Invention

The present invention relates to a plasma processing apparatus and a plasma processing method that perform a plasma process on a substrate.

2. Description of the Related Art

A semi-batch type apparatus disclosed in Japanese Laid-Open Patent Application No. 2013-45903 is known as an apparatus that performs a plasma process on a substrate such as a semiconductor wafer (hereinafter, "wafer"). More specifically, in Japanese Laid-Open Patent Application No. 2013-45903, five wafers are located on a turntable in a circumferential direction thereof, and an antenna for generating plasma from a gas is arranged so as to face a track of the wafers moving (rotating) by the turntable. In such an apparatus, because the wafers move, when a plasma process, for example, using ammonia ($NH_3$) radicals is performed, there is a need to supply the radicals to the wafers for a long time by forming a radical generation area as long as possible in a moving direction of the wafers.

Japanese Laid-Open Patent Application Publication No. 2011-119659 and Japanese Laid-Open Patent Application Publication No. 2003-22977 disclose a single type apparatus including an antenna and a floating coil including a capacitor. More specifically, in Japanese Laid-Open Patent Application Publication No. 2011-119659, the floating coil is arranged above an antenna for plasma generation that is wound around a vertical axis, and a capacitance of a variable capacitor connected to the floating coil is adjusted. By adjusting the capacitance of the variable capacitor, an amount of energy that is transferred from the antenna for plasma generation to the floating coil is adjusted, and a plasma density in the vicinity of a susceptor is controlled in a radial direction of the susceptor in Japanese Laid-Open Patent Application Publication No. 2003-22977. However, Japanese Laid-Open Patent Application Publication No. 2011-119659 and Japanese Laid-Open Patent Application Publication No. 2003-22977 do not disclose a wafer rotation type apparatus and plasma distribution thereof.

SUMMARY OF THE INVENTION

Embodiments of the present invention provide a plasma processing apparatus and a plasma processing method solving one or more of the problems discussed above.

More specifically, embodiments of the present invention provide a plasma processing apparatus and a plasma processing method that can expand a plasma generation area when seen in a plan view while reducing an increase in costs of the apparatus in performing a plasma process on a rotating substrate.

According to one embodiment of the present invention, there is provided a plasma processing apparatus configured to perform a plasma process on a substrate. The plasma processing apparatus includes a vacuum chamber, a turntable provided in the vacuum chamber and configured to rotate a substrate loading area to receive the substrate, a process gas supply part to supply a process gas to a substrate, a main antenna provided to face a passing area of the substrate and having a coiled shape configured to excite the process gas and to generate first induction coupled plasma when high frequency power is supplied thereto, and an auxiliary antenna having a coiled shape and kept electrically insulated from the main antenna at a position capable of causing electromagnetic induction with the main antenna. The auxiliary antenna is provided so that a first projection area thereof does not overlap with at least a part of a second projection area of the main antenna when seen in a plan view and configured to excite the process gas and to generate second induction coupled plasma. A capacitor is provided in a loop formed by the auxiliary antenna.

According to another embodiment of the present invention, there is provided a substrate processing method to perform a plasma process on a substrate. In the method, a substrate is loaded on a substrate loading area formed in an upper surface of a turntable provided in a vacuum chamber, and the substrate is rotated by rotating the turntable. A process gas is supplied to a surface of the substrate, and first induction coupled plasma is generated by supplying high frequency power to a main antenna having a coiled shape and arranged so as to face the turntable and by exciting the process gas. Second induction coupled plasma is caused by an induction current flowing through an auxiliary antenna by electromagnetic induction with the main antenna and by exciting the process gas. The auxiliary antenna has a coiled shape and keeps electrically insulated from the main antenna at a position capable of causing electromagnetic induction with the main antenna. The auxiliary antenna is provided so that a first projection area thereof does not overlap with at least a part of a second projection area of the main antenna when seen in a plan view. The induction current flowing through the auxiliary antenna is resonated by using a capacitor provided in a loop formed by the auxiliary antenna.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1A:
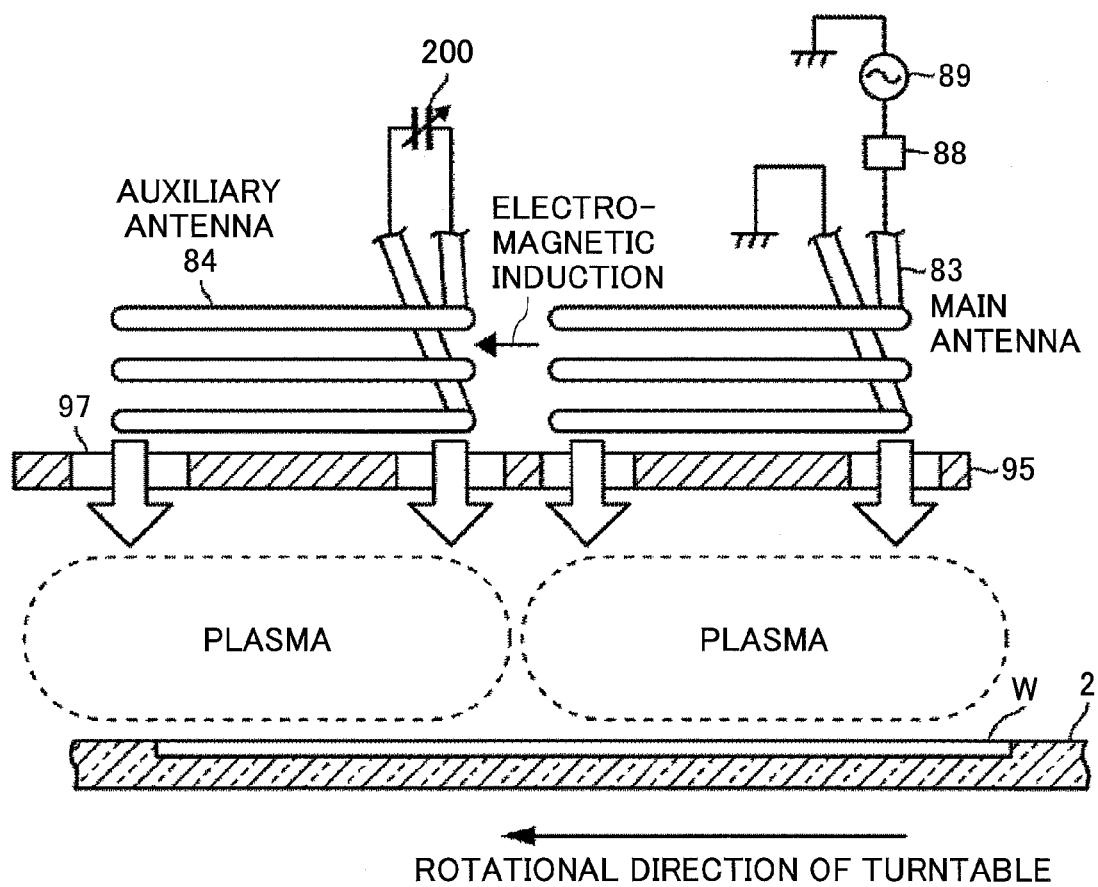
FIGS. 1A and 1B are schematic diagrams illustrating an example of a plasma processing apparatus according to an embodiment of the present invention.
Figure 1B:
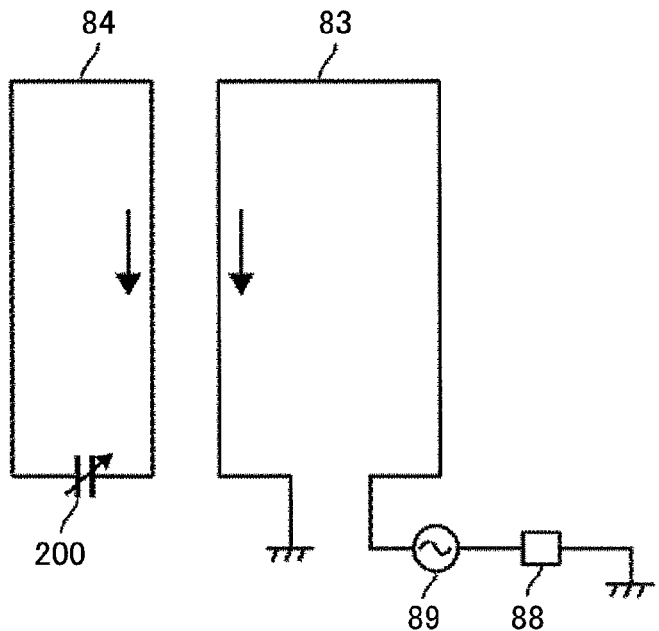

A description is given below of a plasma processing apparatus of an example according to an embodiment of the present invention, with reference to FIGS. 1A through 9. The plasma processing apparatus includes a main antenna 83 connected to a high frequency power source 89 and an auxiliary antenna (inductor) 84 that is electrically insulated to the main antenna 83, as illustrated in FIG. 1A by schematically emphasizing characterizing portions. Moreover, as illustrated in FIG. 1B, plasma is generated through lower areas of the antennas 83 and 84 by electromagnetic induction between the auxiliary antenna 84 and the main antenna 83, without connecting the auxiliary antenna 84 to the high frequency power source. Subsequently, a description is given below of specific configurations of the plasma processing apparatus. Here, in FIG. 1A, the antennas 83 and 84 are simplistically depicted.

Figure 2:
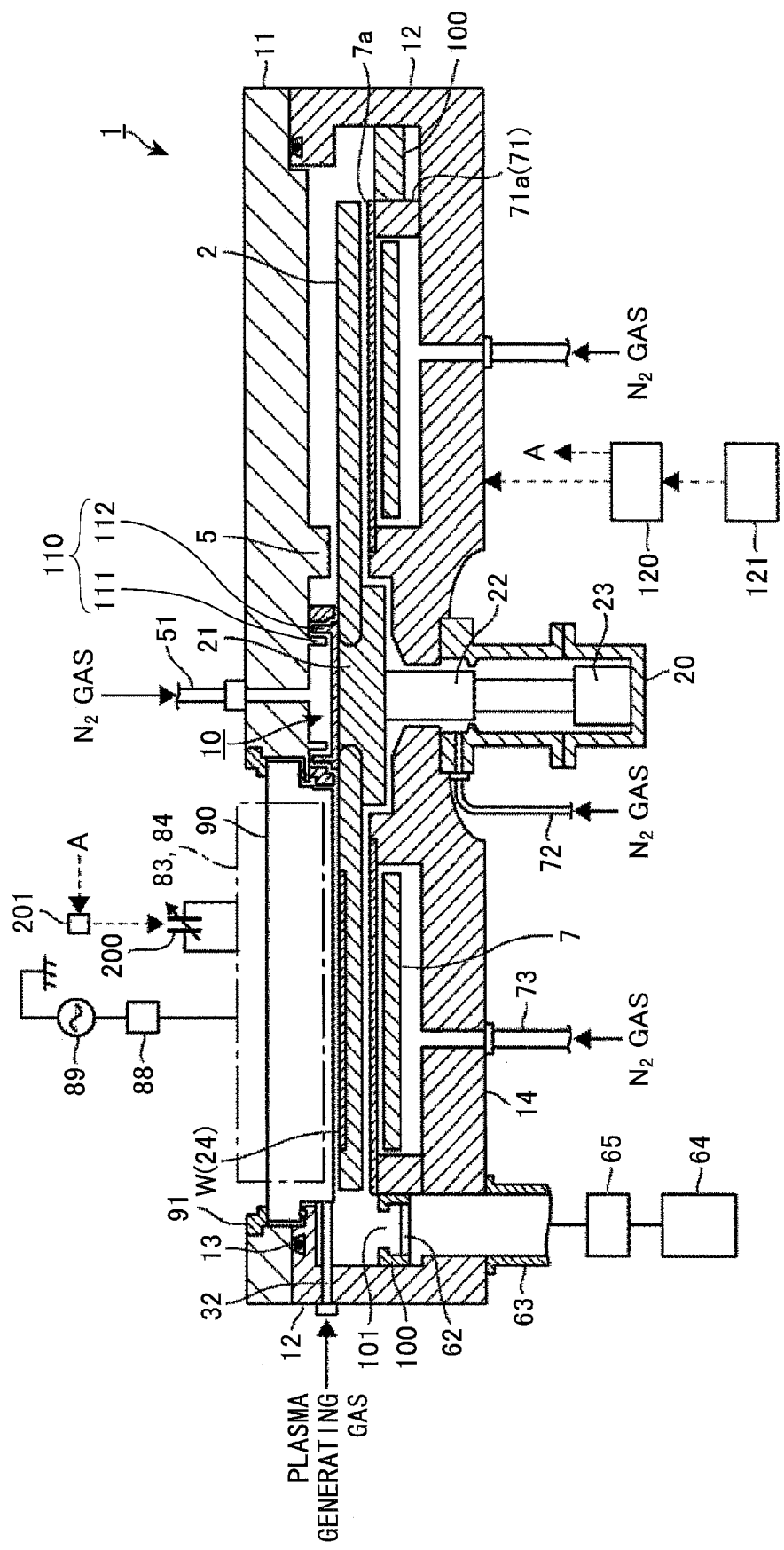
FIG. 2 is a vertical cross-sectional diagram illustrating an example of the plasma processing apparatus according to an embodiment of the present invention.
Figure 3:
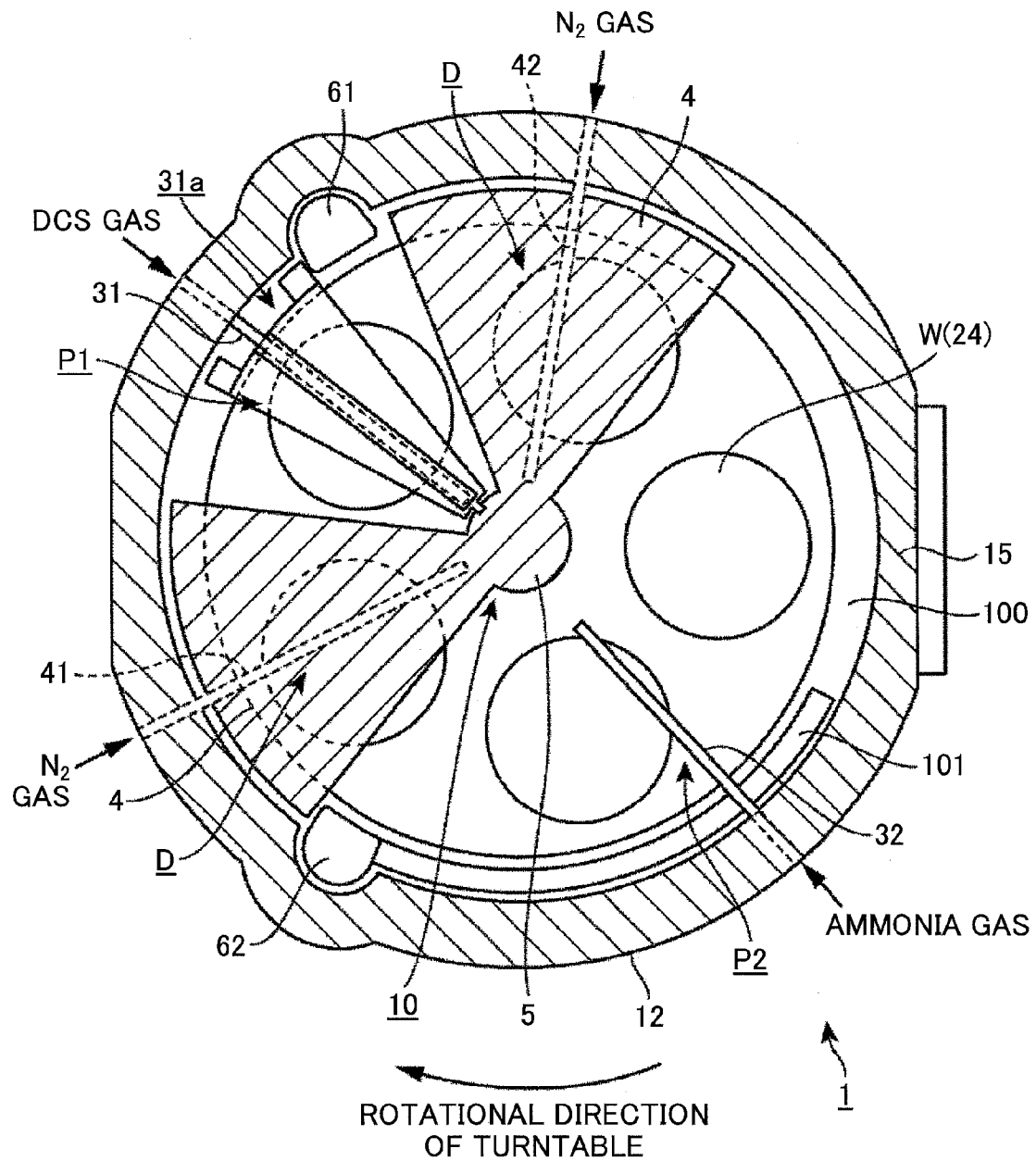
FIG. 3 is a horizontal cross-sectional plan view illustrating the plasma processing apparatus according to an embodiment of the present invention.
Figure 4:
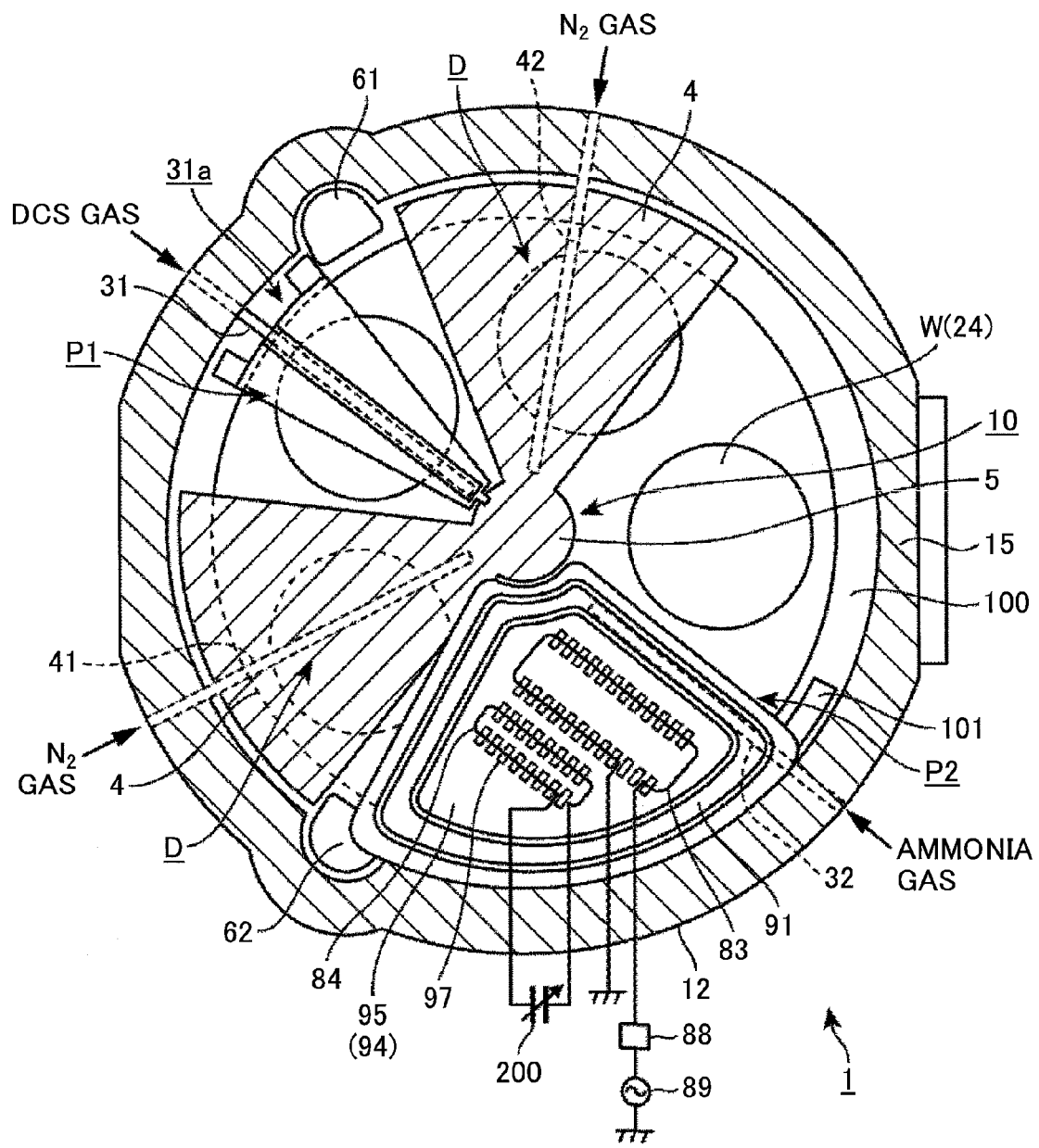
FIG. 4 is a horizontal cross-sectional plan view illustrating the plasma processing apparatus according to an embodiment of the present invention.

As shown in FIGS. 2 through 4, a vacuum chamber 1 having an approximately circular planar shape is provided below the above-mentioned antennas 83 and 84. The vacuum chamber 1 includes a ceiling plate 11 and a chamber body 12, and is configured to allow nitrogen ($N_2$) gas to be supplied thereinto as a separation gas through a separation gas supply pipe 51 connected to a center portion in an upper surface of the ceiling plate 11. As shown in FIG. 2, a heater unit 7 that is a heating mechanism is provided under the turntable 2 to heat a wafer W on the turntable 2 through the turntable 2 up to a predetermined film deposition temperature, for example, 300 degrees C. In FIG. 2, a seal member, for example, an O-ring 13 is provided in a periphery in an upper surface of the chamber body 12. Furthermore, in FIG. 2, a cover member 71a of the heater unit 7, a covering member 7a covering the heater unit 7 and purge gas supply pipes 72 and 73 are provided in the vacuum chamber 1.

Inside the vacuum chamber 1, the turntable 2 is accommodated, and a core portion 21 having an approximately cylindrical shape is fixed to the center portion of the turntable 2. The turntable 2 is configured to be rotatable by a rotational shaft 22 connected to a lower surface of the core portion 21 and extending in a vertical direction, around the vertical axis in a clockwise direction in this example. As shown in FIGS. 3 and 4, circular concave portions 24 are provided as a substrate loading area to hold the wafer W by laying down the wafer W therein. The concave portions 24 are formed at a plurality of locations, for example, at five locations along a rotational direction (i.e., circumferential direction) of the turntable 2. FIG. 2 illustrates a drive part (i.e. a rotation mechanism) 23 provided to rotate the rotational shaft 22 around the vertical axis, and a case body 20 to house the rotational shaft 22 and the drive part 23.

Four nozzles 31, 32, 41 and 42 each made of, for example, quartz are arranged in a radial fashion at intervals in the circumferential direction of the vacuum chamber 1 at respective positions opposite to a passing area of the concave portions 24. These nozzles 31, 32, 41 and 42 are each installed, for example, so as to horizontally extend facing the wafer W from an outer peripheral wall of the vacuum chamber 1 toward a center area 10. In this example, a plasma generating gas nozzle 32, a separation gas nozzle 41, a process gas nozzle 31 and a separation gas nozzle 42 are arranged in this order in a clockwise fashion (i.e., the rotational direction of the turntable 2) when seen from a transfer opening 15 described below. The plasma generating gas nozzle 32 forms a plasma generating gas supply part. In addition, each of the separation gas nozzles 41 and 42 forms a separation gas supply part. Here, FIG. 3 illustrates a state of removing the antennas 83 and 84 and a casing 90 from the chamber body 12 so as to make the plasma generating gas nozzle 32 visible. FIG. 4 illustrates a state of attaching the antennas 83 and 84 and the casing 90 to the chamber body 12.

The respective nozzles 31, 32, 41 and 42 are connected to the following respective gas sources (not shown in the drawings) through a flow rate controlling valve. That is to say, the process gas nozzle 31 is connected to a supply source of a process gas including Si (silicon) such as DCS (dichlorosilane) gas or the like. The plasma generating gas nozzle 32 is connected to at least one of supply sources of ammonia gas and nitrogen ($N_2$) gas. In this example, the plasma generating gas 32 is connected to a supply source of ammonia gas. Each of the separation gas nozzles 41 and 42 is connected to a gas supply source of nitrogen gas that is the separation gas. A plurality of gas discharge holes 33 is arranged at a plurality of locations along the radial direction of the turntable 2, for example, at regular intervals. The gas discharge holes are formed, for example, in lower surfaces of the gas nozzles 31, 41 and 42, and in side surfaces on the upstream side in the rotational direction of the turntable 2 of the plasma generating gas nozzle 32. FIGS. 3 and 4 illustrate a nozzle cover 31a covering an upper surface of the process gas nozzle 31.

An area under the process gas nozzle 31 becomes an adsorption area P1 to adsorb a component of the process gas on the wafer W. Moreover, an area under the plasma generating gas nozzle 32 (area under a casing 90 described later) becomes a reaction area (process area) P2 to react the component of the process gas adsorbed on the wafer W with plasma from a plasma generating gas. The separation gas nozzles 41 and 42 are respectively provided to form separation areas D for separating the first process area P1 and the second process area P2 from each other. As shown in FIGS. 3 and 4, approximately sectorial convex portions 4 are provided on the ceiling plate 11 of the vacuum chamber 1 in the separation areas D, and the separation gas nozzles 41 and 42 are housed in the convex portions 4.

Figure 5:
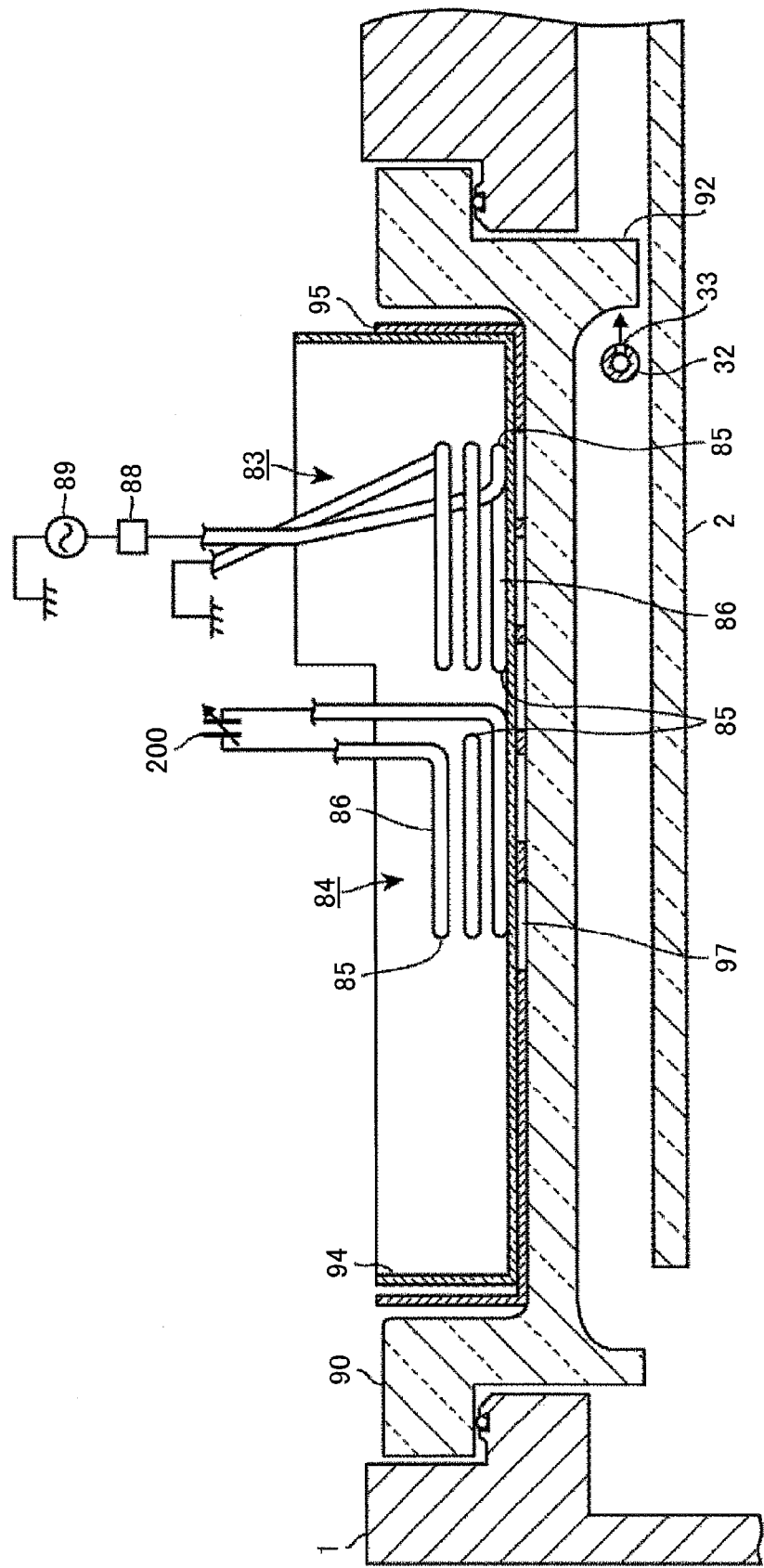
FIG. 5 is a cross-sectional diagram illustrating the plasma processing apparatus according to an embodiment of the present invention.

Next, a description is given below of a configuration for generating induction plasma from a plasma generating gas. As illustrated in FIGS. 1, 4 and 5, the above-mentioned main antenna 83 and the auxiliary antenna 84 are arranged in the vacuum chamber 1, and each of the antennas 83 and 84 is configured to wind a metal wire around the vertical axis into a coil form, for example, three times. The main antenna 83 is arranged on the upstream side in the rotational direction of the turntable 2 relative to the auxiliary antenna 84. To begin with, a description is given of the main antenna 83 of the antennas 83 and 84.

Figure 7:
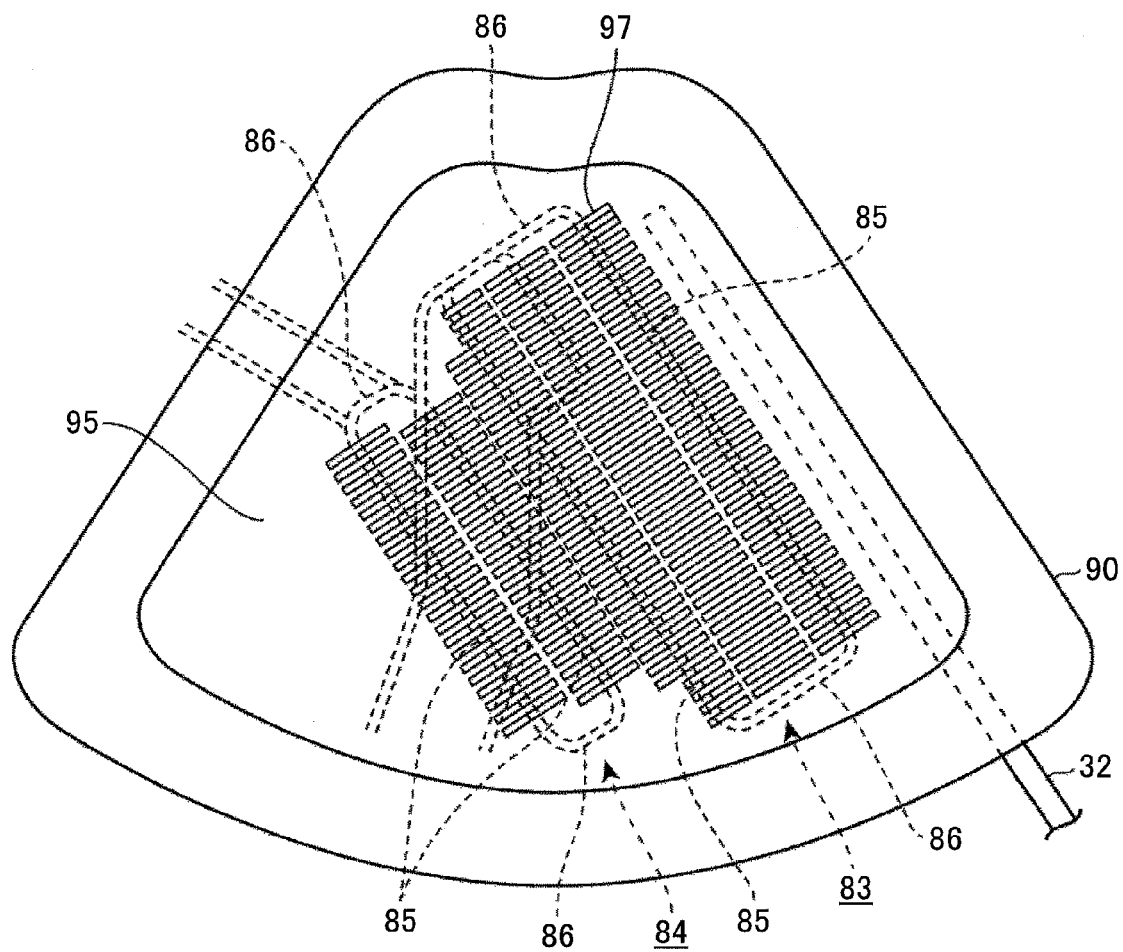
FIG. 7 is a plan view illustrating the antenna in FIG. 6.

As illustrated in FIG. 7, the main antenna 83 is arranged to cross a wafer W passing area on the turntable 2 extending from the central side to the peripheral side of the turntable 2 when seen in a plan view. In this example, the main antenna 83 is wound around so as to form an approximate rectangle (oblong) when seen in a plan view. In other words, portions on the upstream side and the downstream side in the rotational direction of the turntable 2 and on the central side and the peripheral side of the turntable 2 of the main antenna 83 are formed in a linear fashion, respectively.

More specifically, when the portions on the upstream side and the downstream side in the rotational direction in the main antenna 83 are called "straight portions 85", these straight portions 85 are respectively formed along the radial direction of the turntable 2, in other words, along a lengthwise direction of the plasma generating nozzle 32. Furthermore, when the portions on the central side and the peripheral side in the main antenna 83 are called "connecting portions 86", these connecting portions 86 are formed along a tangential direction of the turntable 2. These straight portions 85 and the connecting portions 86 are connected to each other in series through portions approximately bending orthogonally at respective edges thereof, and are connected to the high frequency power source 89 through a matching box 88. In this example, the high frequency power source 89 has, for example, a frequency of 13.56 MHz and an output power of 5000 W.

The straight line portion 85 on the upstream side in the rotational direction of the turntable 2 of two of the straight portions 85 are, as illustrated in FIG. 7, arranged at a position slightly apart from the plasma generating gas nozzle 32 on the downstream side in the rotational direction of the turntable 2 when seen in a plan view. Here, in FIGS. 7 and 8, the antennas 83 and 84 are depicted by dashed lines, and in FIG. 8, the wafer W is depicted by a solid line.

The auxiliary antenna 84 is arranged close to the main antenna 83 on the downstream side in the rotational direction of the turntable 2 when seen from the main antenna 83, and is electrically insulated from the main antenna 83. Accordingly, the antennas 83 and 84 are arranged so that projection areas thereof are not overlapped with each other when seen in a plan view. In addition, the auxiliary antenna 84 is arranged so as to surround a slightly smaller rectangular area than the main antenna 83 when seen in a plan view. The auxiliary antenna 84 is provided at a position having approximately equal distances to the rotation center of the turntable 2 and to the outer periphery of the turntable 2.

Moreover, with respect to the auxiliary antenna 84, the straight portions 85 on the upstream side and the downstream side in the rotational direction of the turntable 2 are arranged linearly along the plasma generating gas nozzle 32, respectively. The connecting portions 86 on the rotational center side and the peripheral side of the turntable 2 of the auxiliary antenna 84 are formed along the tangential direction of the turntable 2, respectively. Accordingly, the straight portions 85 in the main antenna 83 and the straight portions 85 in the auxiliary antenna 84 are parallel to each other.

Figure 8:
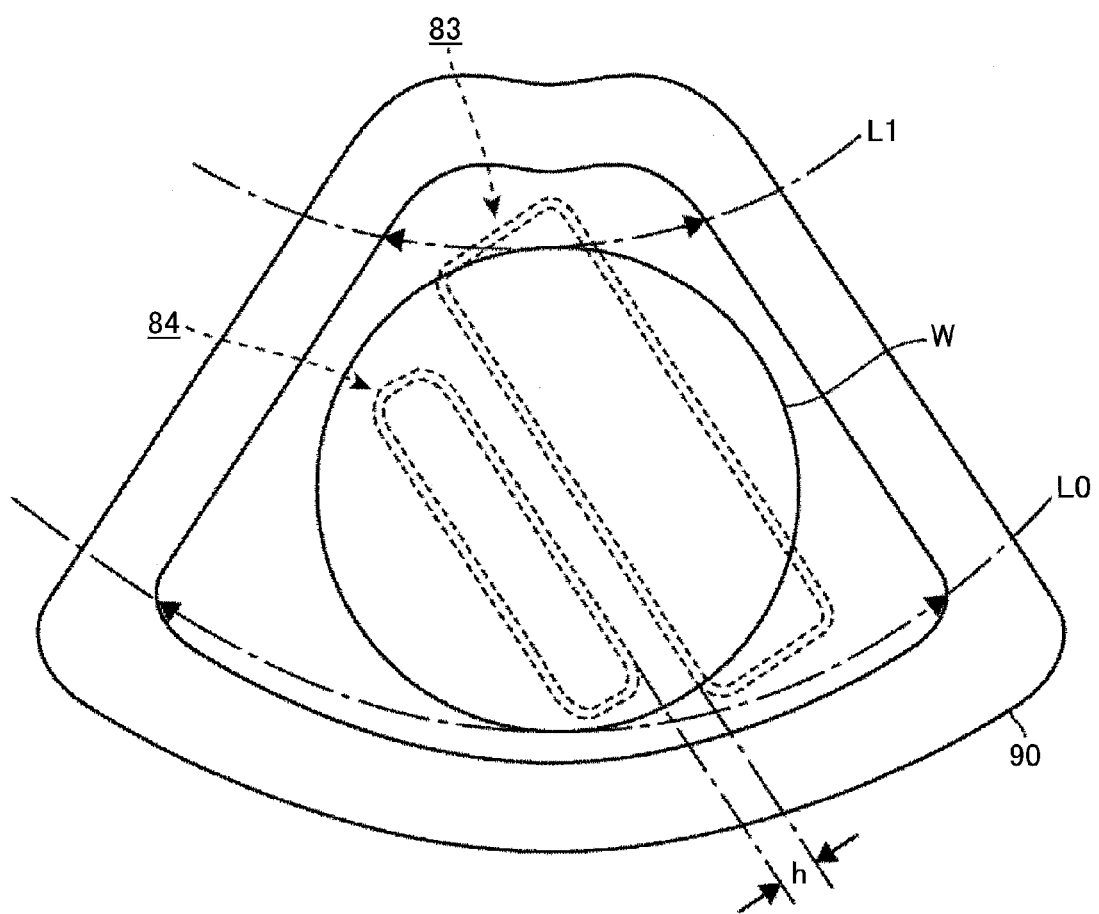
FIG. 8 is a plan view illustrating a positional relationship between the antenna and a wafer.

As illustrated in FIG. 8, a clearance h between the straight portions 85 on the upstream side in the rotational direction of the turntable 2 in the auxiliary antenna 84 and the straight portions 85 on the upstream side in the rotational direction of the turntable 2 in the main antenna 83 is set at a dimension that allows a high frequency field caused by the main antenna 83 to reach the auxiliary antenna 84. The clearance h is specifically set at 2 to 30 mm.

In other words, when high frequency power is supplied to the main antenna 83, the high frequency field is generated around the axis extending in a lengthwise direction of the main antenna 83 by a high frequency current flowing through the antenna 83. In addition, as discussed above, the auxiliary antenna 84 is not connected to the high frequency power source 89, and is in a state that is electrically insulated and floating (i.e., a floating state) from the main antenna 83. Hence, the high frequency field formed around the main antenna 83 causes an induced electromotive force to be generated in the auxiliary antenna 84 so as to cause an induced current to flow therethrough by way of electromagnetic induction between the main antenna 83 and the auxiliary antenna 84.

Here, a magnitude of the induced current flowing through the auxiliary antenna 84 is examined. A resonance frequency f (Hz) is expressed as the following formula.

$$f = 1/(2\pi\sqrt{L \times C})$$

Here, f is a frequency of high frequency power supplied to the main antenna 83 (auxiliary antenna 84); L is an inductance (H) of the auxiliary antenna 84; and C is a capacitance value (F) of the auxiliary antenna 84. When the above formula is changed into a formula to express the capacitance value C, the following formula is obtained.

$$C = 1/(4\pi^2 \times f^2 \times L)$$

For example, when a frequency of 13.56 MHz and an inductance of 2.62 µH are plugged into the above formula, the capacitance value C that generates a series resonance in the auxiliary antenna 84 is about 52.6 pF. More specifically, when the capacitance value C of the auxiliary antenna 84 is 52.6 pF, the series resonance is generated in the auxiliary antenna 84 by the high frequency field transferred from the main antenna 83 to the auxiliary antenna 84, and plasma is generated in an area under the auxiliary antenna 84 in addition to an area under the main antenna 83. Therefore, in the embodiment of the present invention, the main antenna 83 and the auxiliary antenna 84 are configured to generate the resonance in the auxiliary antenna 84 and further to be able to adjust a state of the resonance generated in the auxiliary antenna 84.

More specifically, as illustrated in FIGS. 1 and 4 through 6, a capacitance adjusting part 200 constituted of a variable capacitor (variable capacitance capacitor) for adjusting the capacitance value C of the auxiliary antenna 84 is provided in the auxiliary antenna 84 as an impedance adjustment part. More specifically, one and the other terminals of both terminals of the capacitance adjusting part 200 are respectively connected to one end and the other end of the auxiliary antenna 84 in the lengthwise direction thereof so as to be arranged in a loop of the auxiliary antenna 84. Moreover, as illustrated in FIG. 2, a drive unit 201 constituted of a motor and the like is connected to the capacitance adjusting part 200, which is configured to adjust the capacitance value C of the capacitance adjusting part 200 (auxiliary antenna 84) by driving the drive unit 201.

When a configuration example of such a capacitance adjusting part 200 or a drive unit 201 is illustrated, the capacitance adjusting part 200 includes, for example, a pair of opposite electrodes (not shown in the drawing), one of which is connected to an elevating shaft (drive shaft) (not shown in the drawing) extending from the above-mentioned drive unit 201. By changing a clearance of one electrode to the other electrode by way of the drive unit 201, the capacitance value of the capacitance adjusting part 200, in other words, the capacitance value C of the auxiliary antenna 84 is adjusted. Then, when directions of the currents flowing through the main antenna 83 and the auxiliary antenna 84 become opposite to each other in a plan view by the impedance of the auxiliary antenna 84, as illustrated in FIG. 1B discussed above, a direction of the currents flowing through the main antenna 83 and the auxiliary antenna 84 is determined so as to be superimposed (so as not to be canceled). The adjustment of the capacitance value C (drive of the drive unit 200) is performed by a control signal from a control unit 120 described later. A variable range of the capacitance value of the capacitance adjusting part 200 is lower than, for example, 50 pF, and a variable range of the capacitance value C of the whole auxiliary antenna 84 is in a range from 50 to 500 pF.

Figure 6:
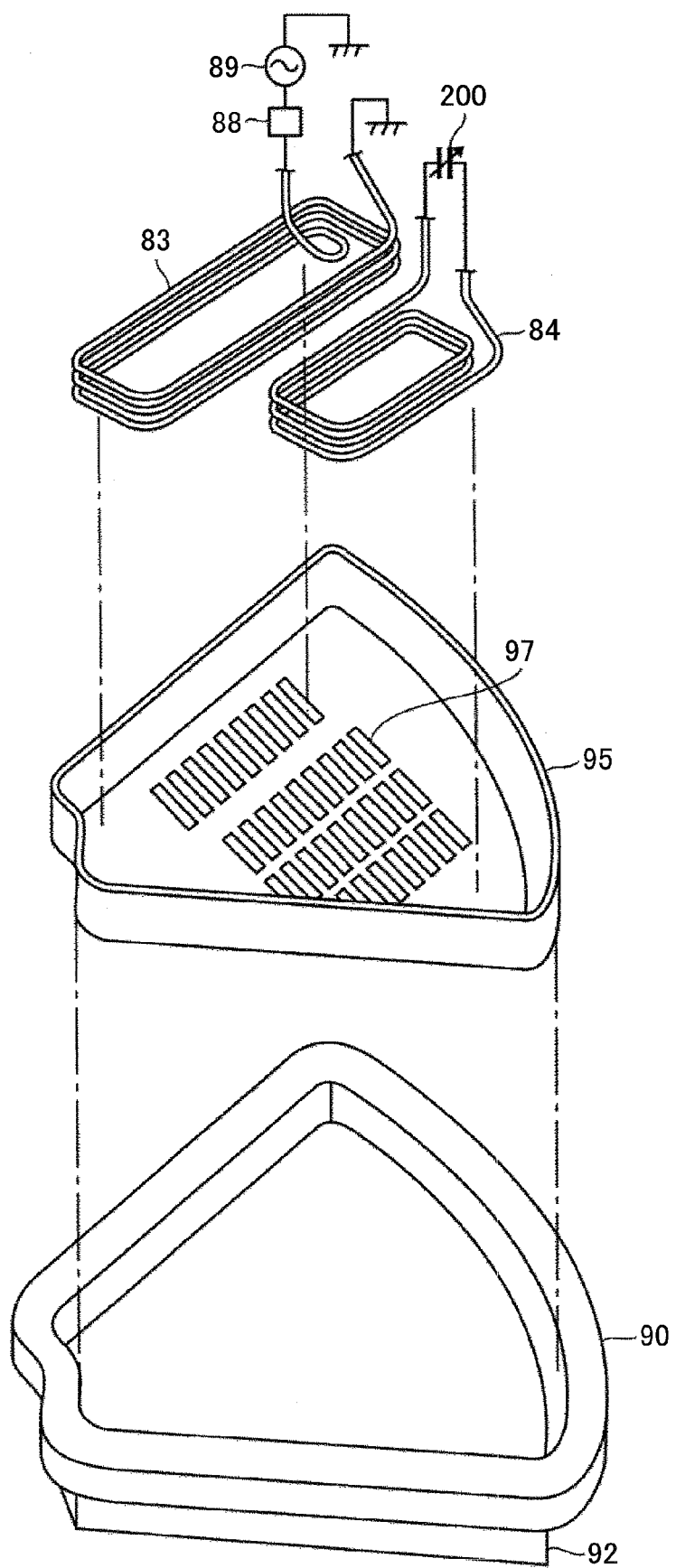
FIG. 6 is an exploded perspective view illustrating an antenna of the plasma processing apparatus according to an embodiment of the present invention.

The antennas 83 and 84 described above are arranged to be air-tightly separated from the inner area of the vacuum chamber 1. That is to say, the ceiling plate 11 above the plasma generating gas nozzle 32 is opened to have an approximately sector shape when seen in a plan view, and for example, is hermetically closed by a casing 90 made of quartz and the like. This casing 90, as illustrated in FIGS. 5 and 6, has a peripheral part horizontally extending in a flanged form along a circumferential direction in an upper portion, and a central part formed into a hollow shape sinking toward the inner area of the vacuum chamber 1. The antennas 83 and 84 are accommodated inside the casing 90. The casing 90 is fixed to the ceiling plate 11 by a fixing member 91. Here, the fixing member 91 is depicted in FIG. 2, but omitted in the other drawings except for FIG. 2.

Figure 9:
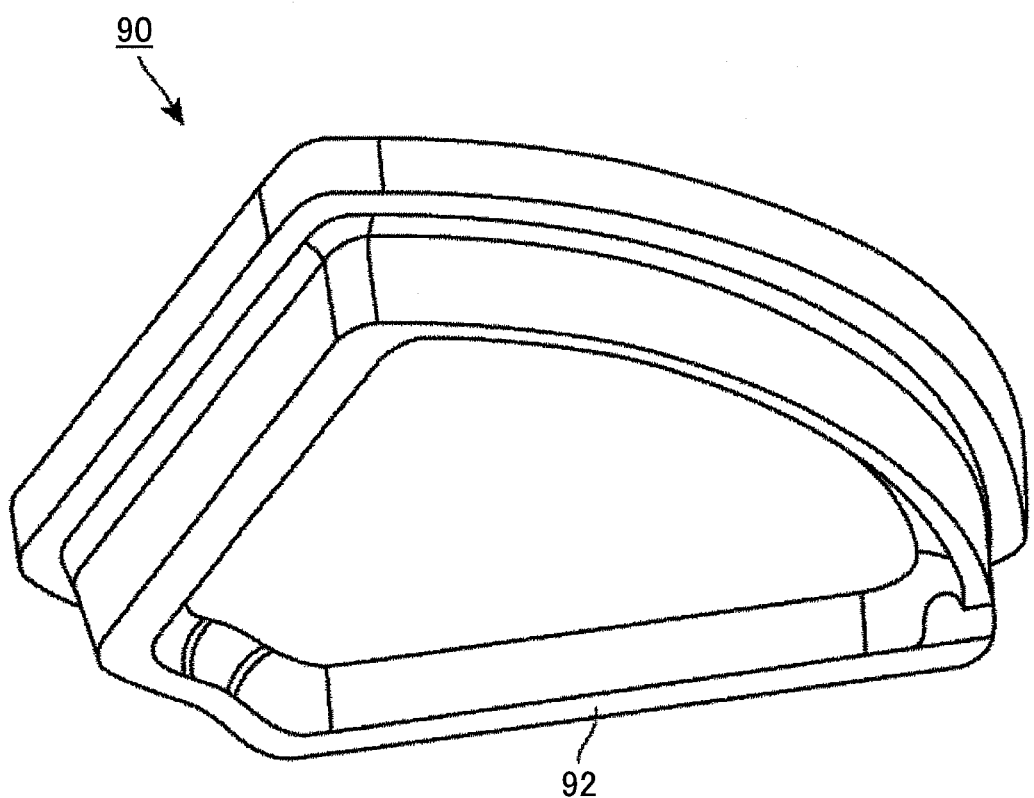
FIG. 9 is a perspective view illustrating a configuration of a housing that accommodates the antenna when seen from a lower perspective.

As shown in FIGS. 2 and 9, a peripheral portion of the lower surface of the casing 90 perpendicularly extends downward (toward the turntable 2) throughout the circumference and forms a wall portion 92 to prevent nitrogen gas and the like from entering an area under the casing 90. As noted from FIGS. 4 through 9, portions on the upstream side and the downstream side in the rotational direction of the turntable 2 in the wall portion 92 extend from the center of the turntable 2 in a radial fashion so as to diverge from each other in the circumferential direction of the turntable 2.

Moreover, as illustrated in FIG. 5, a portion on the outer circumference side of the turntable 2 in the wall portion 92 is located outside the outer edge of the turntable 2. Then, when an area surrounded by an inner periphery of the wall portion 92, a lower surface of the casing 90 and an upper surface of the turntable 2 is called a "reaction area P2", the reaction area P2 is zoned to form a sector shape by the wall portion 92. The above-mentioned plasma gas generating gas nozzle 32 is arranged in the vicinity of the wall portion 92 in an end on the upstream side in the rotational direction of the turntable 2 within the reaction area P2.

In other words, as illustrated in FIG. 9, a lower end of the wall portion 92 is bent upward along the outer surface of the plasma generating gas nozzle 32 at a location where the plasma generating gas nozzle 32 is inserted, and is arranged to have a height position close to the turntable along the circumferential direction in the other location. As illustrated in FIG. 5, the gas discharge holes 33 of the plasma generating gas nozzle 32 are formed in a side surface thereof to face laterally toward the wall portion 92 on the upstream side in the rotational direction of the turntable 2 among the wall portion 92 surrounding around the reaction area P2.

Here, as discussed above, the wafer W is rotated by the turntable 2, and passes through the areas P1 and P2 under each of the nozzles 31 and 32. Because of this, the wafer W on the turntable 2 has different speeds (angular rate) at an end on the rotational center side and an end on the outer peripheral side of the turntable 2 when passing each of the process areas P1 and P2. More specifically, when a diameter dimension of the wafer W is 300 mm (12 inch size), the speed at the end on the rotational center side is one third of the speed at the end on the outer peripheral side.

More specifically, when a distance from the rotational center of the turntable 2 to the end of the wafer W on the rotational center side is made s, a length dimension DI of a circumference of a circle that the end of the wafer W on the rotational center side passes through equals $(2 \times \pi \times s)$. On the other hand, a length dimension DO of a circumference of a circle that the end of the wafer W on the outer peripheral side passes through equals $(2 \times \pi \times (s+300))$. Furthermore, the wafer W moves the length dimensions DI and DO for the same time period by the rotation of the turntable 2. Due to this, when the speeds at the end on the rotational center side and the outer peripheral side of the wafer W on the turntable 2 are made VI and VO, respectively, a ratio R of these speeds VI to VO (VI/VO) equals $(s/(s+300))$. Then, when the distance s is 150 mm, the ratio R equals ⅓.

Accordingly, when plasma that does not have a high reactivity with the component of DCS gas adsorbed on the wafer W is used such as plasma from ammonia gas, simply converting ammonia gas to plasma in the vicinity of the plasma generating gas nozzle 32 is liable to cause a thin film (reaction product) to become thinner at the outer peripheral side than at the central side.

Therefore, in the embodiment of the present invention, a shape of the wall portion 92 is adjusted to perform a uniform plasma process on the wafer W. More specifically, as illustrated in FIG. 8, when a length dimension of the reaction area P2 through which the end on the rotational center of the wafer W on the turntable 2 passes and a length dimension of the reaction area P2 through which the end on the outer peripheral side of the wafer W on the turntable 2 passes are made LI and LO, respectively, a ratio of these length dimensions LI to LO (LI/LO) equals one third. In other words, a shape of the wall portion 92 (a dimension of the reaction area P2) is set depending on the speed at which the wafer W on the turntable 2 passes through the reaction area P2. Then, as described later, also because the reaction area P2 is filled with plasma of ammonia gas, the plasma process is performed uniformly through a surface of the wafer W.

As illustrated in FIGS. 4 through 7, a Faraday shield 95 is provided between the casing 90 and the antennas 83 and 84 to prevent a component of an electric field of an electromagnetic field generated in the antenna 83 and 84 from going downward and to allow a component of a magnetic field of the electromagnetic field to pass downward. More specifically, the Faraday shield 95 is formed to have an approximately box-like shape whose upper side is open, and is made of a metal plate (conductive plate) that is a conductive plate-like body and grounded. Slits that form rectangular openings in the metal plate are provided in the bottom surface of the Faraday shield 95 to allow the magnetic field to pass therethrough.

Each of the slits 97 is not in communication with the other adjacent slits 97. In other words, each of the slits 97 is surrounded by the metal plate constituting the Faraday shield 95 throughout the circumferential direction. The slits 97 are formed to extend in a direction perpendicular to the lengthwise direction of the antennas 83 and 84, and arranged along the lengthwise direction of the antennas 83 and 84 at a plurality of locations at regular intervals under the antennas 83 and 84. In addition, the slits 97 are not formed at a position directly above the plasma generating gas nozzle 32, which prevents ammonia gas in the plasma generating gas nozzle 32 from converting to plasma thereinside.

Here, as illustrated in FIGS. 6 and 7, while the slits 97 are formed at positions under the straight portions 85 of the antennas 83 and 84, the slits 97 are not formed at positions under the bending portions at both ends of the straight portions 85 and under the connecting portions 86. In other words, when trying to form the slits 97 throughout the circumferential direction of the antennas 83 and 84, the slits 97 are arranged crookedly along the antennas 83 and 84 at portions where the antennas 83 and 84 bend (R portions). However, in this case, the slits 97 adjacent to each other are liable to communicate with each other in areas corresponding to the inner side of the antennas 83 and 84 at the bending portions, which reduces an effect of blocking the electric field. On the other hand, if a width dimension of the slits 97 are narrowed so as not to communicate with the slits 97 adjacent to each other at the bending portions, an amount of the component of the magnetic field reaching the wafer W at the bending portions becomes less than that at the straight portions 85. Furthermore, if distances between the slits 97 adjacent to each other are increased in an area corresponding to the outer portion of the antennas 83 and 84, the component of the electric field in addition to the component of the magnetic field reaches the wafer W, which is liable to cause a charging damage to the wafer W.

Thus, according to the embodiment of the present invention, in order to make uniform the amount of the magnetic field reaching the wafer W from the main antenna 83 through each of the slits 97, the straight portions 85 in the main antenna 83 are arranged so as to cross the position through which the wafer W passes, and the slits 97 are formed under the straight portions 85. Moreover, the slits 97 are not formed under the bending portions extending from both ends of the straight portions 85, but the conductive plate constituting the Faraday shield 95 is arranged to block not only the component of the electric field but also the component of the magnetic field. Hence, as described later, an amount of plasma generation is made uniform throughout the radial direction of the turntable 2.

Accordingly, when one of the slits 97 at any position is seen, an opening width of the slit 97 is uniform throughout the lengthwise direction of the slit 97. Furthermore, the opening width of the slits 97 is adjusted to be uniform in all of the other slits 97 in the Faraday shield 95.

An insulating plate 94 made of, for example, quartz is provided between the Faraday shield 95 and the antennas 83 and 84 described above to obtain insulation therebetween, and the insulating plate 94 has an approximately box-like shape. Here, in FIG. 8, the Faraday shield 95 is omitted to illustrate a positional relationship between the antennas 83 and 84 and the wafer W. Moreover, in the drawings other than FIG. 5, the depiction of the insulating plate 94 is omitted.

As illustrated in FIGS. 2 through 4, a ring-shaped side ring 100 is arranged at a position slightly lower than the turntable 2 and outer edge side of the turntable 2, and exhaust openings 61 and 62 are formed in an upper surface of the side ring 100 at two locations apart from each other in the circumferential direction. When one is called a first exhaust opening 61 and the other is called a second exhaust opening 62 of the two exhaust openings 61 and 62, the first exhaust opening 61 is formed at a position closer to the separation area D between the process gas nozzle 31 and the separation area D on the downstream side of the process gas nozzle 31 in the rotational direction of the turntable 2. The second exhaust opening 62 is formed at a position closer to the separation area D between the plasma generating gas nozzle 32 and the separation area D on the downstream side of the plasma generating gas nozzle 32 in the rotational direction of the turntable 2. Accordingly, the second exhaust opening 62 is located at the neighborhood of the apex of an approximate triangle formed by connecting two points of the rotational center of the turntable 2 and an edge part on the reaction area P2 side in the wall portion 92 thereto (see also FIGS. 5 and 6).

The first exhaust opening 61 is to evacuate the process gas and the separation gas, and the second exhaust opening 62 is to evacuate the plasma generating gas and the separation gas. A groove-like gas flow passage 101 is formed in the upper surface of the side ring 100 on the outer edge side of the casing 90 to circulate the gas to the second exhaust opening 62 while avoiding the casing 90. Each of the first exhaust opening 61 and the second exhaust opening 62 is, as shown in FIG. 2, connected to an evacuation mechanism such as a vacuum pump 64 through an evacuation pipe 63 including a pressure controller 65 such as a butterfly valve.

As shown in FIG. 2, in the center portion on the lower surface of the ceiling plate 11, a protrusion portion 5 is provided that protrudes downward from the ceiling plate 11, and the protrusion portion 5 prevents the process gas and the plasma generating gas from mixing with each other in the center area 10. In addition to the protrusion portion 5, a labyrinth structure 110 is provided closer to the rotational center side of the turntable 2 than the protrusion portion 5 to suppress the process gas and the plasma generating gas from mixing with each other in the center area 10. The labyrinth structure 110 adopts a structure that includes a first wall portion 111 vertically extending from the ceiling plate 11 toward the turntable 2 throughout the circumferential direction and a second wall portion 112 vertically extending from the turntable 2 side toward the ceiling plate 11 throughout the circumferential direction that are formed alternately in the radial direction of the turntable 2.

As shown in FIGS. 3 and 4, a transfer opening 15 is provided in the side wall of the vacuum chamber 1 to transfer the wafer W between a transfer arm that is not shown in the drawings but provided outside the vacuum chamber 1 and the turntable 2. The transfer opening 15 is configured to be hermetically openable and closable by a gate valve G. In addition, lift pins are provided at a position facing the transfer opening under the concave portion 24 of the turntable 2 to lift up the wafer W from the back side by penetrating through through-holes formed in the concave portion 24 of the turntable 2.

Moreover, as illustrated in FIG. 2, a control unit 120 constituted of a computer to control operation of the whole apparatus is provided in this film deposition apparatus, and a program to implement the film deposition process described later is stored in a memory of the control unit 120. This memory stores the capacitance value of the capacitance adjusting part 200 for each recipe of a process performed on the wafer W. More specifically, an optimum capacitance value of the capacitance adjusting part 200 is preliminarily obtained depending on a recipe specifying a pressure inside the vacuum chamber 1, gas species to be used and an amount of high frequency power supplied to the main antenna 83, and the optimum capacitance value is stored in the memory corresponding to each recipe. This program is constituted of instructions of step groups to cause the apparatus to implement operations described later, and is installed into the control unit 120 from a memory unit 121 that is a storage medium such as a hard disk, a compact disc, a magnetic optical disk, a memory card and a flexible disk.

Next, a description is given of operation in the embodiment. To begin with, the gate valve G is opened, and while rotating the turntable 2 intermittently, for example, five wafers W are loaded on the turntable 2 through the transfer opening 15 by the transfer arm not shown in the drawings. Next, the gate valve G is closed, and the turntable 2 is rotated at, for example, 2 to 240 rpm in a clockwise fashion while the inside of the vacuum chamber 11 is kept being evacuated by the vacuum pump 64. Then the wafer W is heated by the heater unit 7, for example, up to about 300 degrees C.

Subsequently, DCS gas is discharged from the process gas nozzles 31, and ammonia gas is discharged from the plasma generating gas nozzle 32 so as to make a pressure in the reaction area P2 higher than the other area within the vacuum chamber 1. Moreover, a separation gas is discharged from the separation gas nozzles 41 and 42, and nitrogen gas is discharged from the separation gas supply pipe 51 and the purge gas supply pipe 72 and 73. Then, the pressure controller 65 adjusts a pressure in the vacuum chamber 11 at a preliminarily set processing pressure. In addition, high frequency power, for example, having an electrical energy of 500 W is supplied to the main antenna 83, and the capacitance adjusting part 200 of the auxiliary antenna 84 is set at a capacitance value C that causes a resonance between the main antenna 83 and the auxiliary antenna 84.

In the main antenna 83, an electromagnetic field is generated by the high frequency power supplied from the high frequency power source 89. The Faraday shield 95 blocks a component of an electric field of the electromagnetic field and allows only a component of a magnetic field of the electromagnetic field to reach the vacuum chamber 1. In the meantime, because the auxiliary antenna 84 is arranged adjacent to the main antenna 83, as illustrated in FIG. 1, the electromagnetic field of the main antenna 83 reaches the auxiliary antenna 84. Also, an induced current flows through the auxiliary antenna 84 caused by the electromagnetic field transferred from the main antenna 83, and an electromagnetic field is generated in the auxiliary antenna 84 similarly to the main antenna 83. Because the capacitance value of the capacitance adjusting part 200 is set as stated above in the auxiliary antenna 84, a series resonance of the induced current occurs, and a current value increases more than a case without such a series resonance. Then, the component of the electric field is blocked by the Faraday shield 95 but the component of the magnetic field reaches the inside of the vacuum chamber 1 of the electromagnetic field generated in the auxiliary antenna 84.

In the adsorption area P1, a component of DCS gas is adsorbed on a surface of the wafer W and an adsorbed layer is deposited thereon. At this time, when the wafer W passes through the adsorption area P1, the moving speed is faster on the outer peripheral side than on the central portion side. Because of this, a film thickness of the adsorbed layer is likely to be thinner on the outer peripheral side than on the central portion side. However, because the adsorption of the component of DCS gas occurs quickly, when the wafer W passes through the adsorption area P1, the adsorbed layer is formed uniformly throughout the surface of the wafer W.

Figure 10:
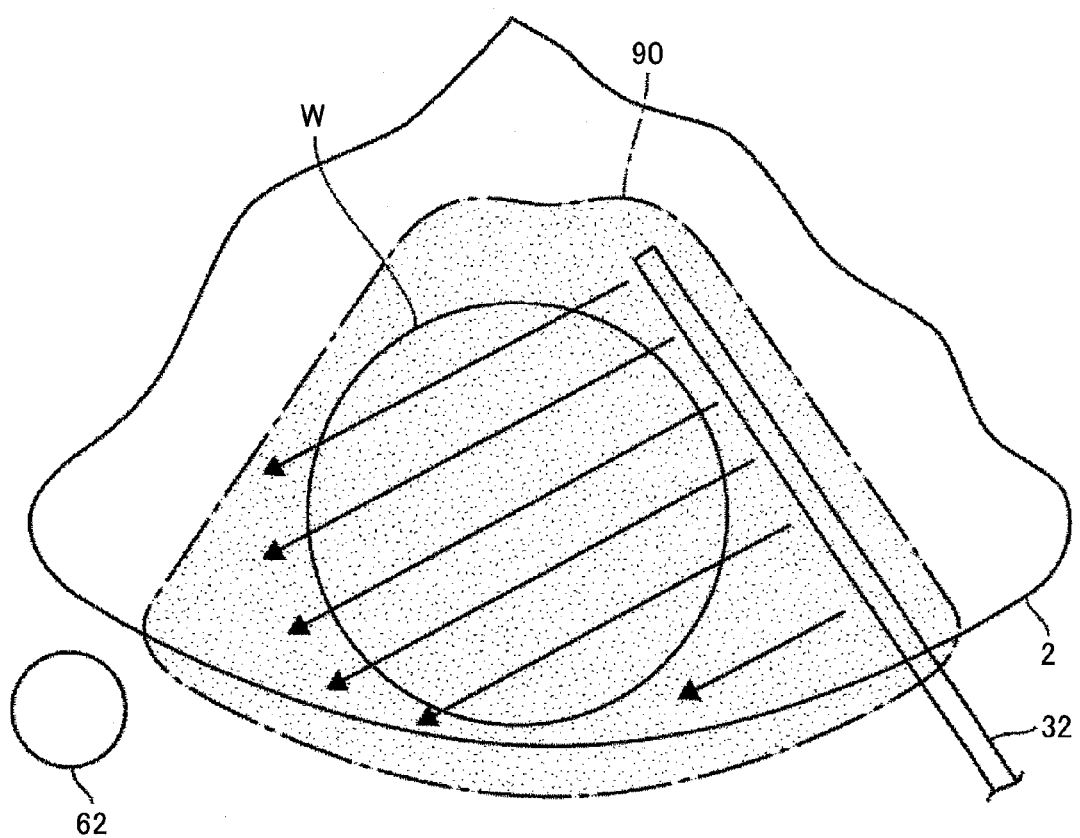
FIG. 10 is a plan view schematically illustrating a track of plasma passing above a wafer.

In the reaction area P2, because the position of the second exhaust opening 62 is set as discussed above, as illustrated in FIG. 10, ammonia gas discharged from the plasma generating gas nozzle 32 flows linearly toward the second exhaust opening 62 after colliding with the wall portion 92 on the upstream side in the rotational direction of the turntable 2 (also see FIG. 5). Then, as illustrated in FIG. 10, ammonia gas is quickly converted to plasma by the magnetic field under the main antenna 83 and becomes ammonia radicals (plasma) on the way to the second exhaust opening 62. Because the opening width of the slits 97 is made uniform throughout the radial direction of the turntable 2, the amount of plasma (density) is made uniform along the radial direction. In this manner, the plasma flows toward the second exhaust opening 62.

In addition, even when the ammonia radicals become inactivated and return to ammonia gas caused by the collision with the wafer W and the like, ammonia gas converts to plasma again under the auxiliary antenna 84. Accordingly, the reaction area P2 is filled with the plasma of ammonia gas also because the pressure in the reaction area P2 is set at a pressure higher than the other area within the vacuum chamber 1.

Moreover, because the dimension of the reaction area P2 is set as discussed above, a time period when the plasma is supplied is made uniform throughout the radial direction of the turntable 2. Hence, when the wafer W passes through the reaction area P2, the adsorbed layer on the wafer W is uniformly nitrided throughout the surface of the wafer W and a reaction layer (silicon nitride film) is deposited. Thus, each of the wafers W passes through the adsorption area P1 and the reaction area P2 alternately by the rotation of the turntable 2, and a thin film is formed by depositing reaction layers in a layer-by-layer manner.

While performing a series of processes, because the gas flow passage 101 is formed in the side ring 100 in the outer peripheral side of the casing 90, each of the gases is evacuated through the gas flow passage 101 so as to bypass the casing 90. Furthermore, because the wall portion 92 is provided on the lower end side in the periphery of the casing 90, the intrusion of nitrogen gas into the casing 90 can be prevented.

In addition, because nitrogen gas is supplied to a space between the adsorption area P1 and the reaction area P2, each of the process gas and the plasma generating gas is evacuated without mixing the process gas and the plasma generating gas (plasma) with each other. Moreover, because the purge gas is supplied to a space under the turntable 2, the process gas and the plasma generating gas are likely to diffuse under the turntable 2 but are forced back toward the exhaust openings 61 and 62 by the purge gas. Furthermore, because the separation gas is supplied to the center area 10, the mixture of the process gas and the plasma generating gas is prevented.

According to the above embodiment, in performing the plasma process on the wafers W rotating on the turntable 2, the main antenna 83 connected to the high frequency power source 89 and the auxiliary antenna 84 electrically insulated from the main antenna 83 are provided. In addition, the main antenna 83 and the auxiliary antenna 84 are arranged so that the projection areas of the main antenna 83 and the auxiliary antenna 84 do not overlap with each other when seen in a plan view. Moreover, the electromagnetic field is also generated at the auxiliary antenna 84 by way of the high frequency current flowing through the main antenna 83, and induction plasma is generated not only in an area under the main antenna 83 but also in an area under the auxiliary antenna 84. Due to this, because a power source for supplying high frequency power to the auxiliary antenna 84 does not need to be provided, the plasma generation area (reaction area P2) when seen in a plan view can be expanded while reducing the increase in costs. In other words, according to the embodiment of the present invention, wire routing can be simplified compared to a configuration of supplying power to the main antenna 83 and the auxiliary antenna 84 from a common high frequency power source because wiring the auxiliary antenna 84 to the high frequency power source 89 is not required, which makes it possible to simplify the apparatus structure (to reduce the costs).

Furthermore, as noted from working examples described later, the density of plasma generated in the space under the main antenna 83 and the space under the auxiliary antenna 84 can be adjusted depending on the capacitance value of the capacitance adjusting part 200. Accordingly, because the amount of plasma generation at the antennas 83 and 84 can be adjusted by simply providing a single high frequency power source 89 corresponding to the main antenna 83, an apparatus having high flexibility of the plasma process can be configured. In other words, the plasma density in the circumferential direction of the turntable 2 can be adjusted without providing the high frequency power source 89 for each of the antennas 83 and 84 individually.

In addition, the wall portion 92 is formed throughout the circumferential direction on the lower surface side in the periphery of the casing 90, and a discharge rate of ammonia gas is adjusted so as to have a higher pressure in the reaction area P2 that is an area surrounded by the wall portion 92 than that in the other area within the vacuum chamber 1. Moreover, the plasma generating gas nozzle 32 is arranged on the upstream side in the rotational direction of the turntable 2 in the reaction area P2, and the gas discharge holes 33 of the plasma generating gas nozzle 32 are formed to face the wall portion 92 on the upstream side in the rotational direction of the turntable 2. Because of this, the intrusion of nitrogen gas into the reaction area P2 can be prevented, which makes it possible to ensure a broad contact area between the wafer W and the plasma throughout the reaction area P2.

Furthermore, the layout of the reaction area P2 is adjusted so as to resolve the speed difference between the inner circumference side and the outer circumference side caused by the rotational speed of the turntable 2. Accordingly, because the quantity of plasma is made uniform across the radial direction of the turntable 2 as discussed above and further a contacting time between the wafer W and the plasma is made uniform, the uniform plasma process can be performed throughout the surface of the wafer W. In other words, as discussed above, because DCS gas adsorbs on the wafer W rapidly, even if a broad adsorption area P1 is not necessarily formed, the adsorbed layer is formed uniformly throughout the surface of the wafer W. On the other hand, in proceeding with the reaction of the adsorbed layer, the plasma of ammonia gas does not have very high reactivity. Hence, by making the plasma density and the contacting time between the plasma and the wafer W uniform, the film thickness of the reaction product can be made uniform across the surface of the wafer W.

In addition, because the plasma is generated along the rotational direction of the turntable 2 by using the antennas 83 and 84, as discussed above, the plasma can be kept widely throughout the rotational direction of the turntable 2. Accordingly, as described above, the high uniform plasma process can be performed while reducing the increase in costs of the apparatus.

Moreover, because the slits 97 are not formed immediately above the plasma generating gas nozzle 32, the attachment such as the reaction product to the inside of the plasma generating gas nozzle 32 or the outer wall can be reduced.

Figure 11:
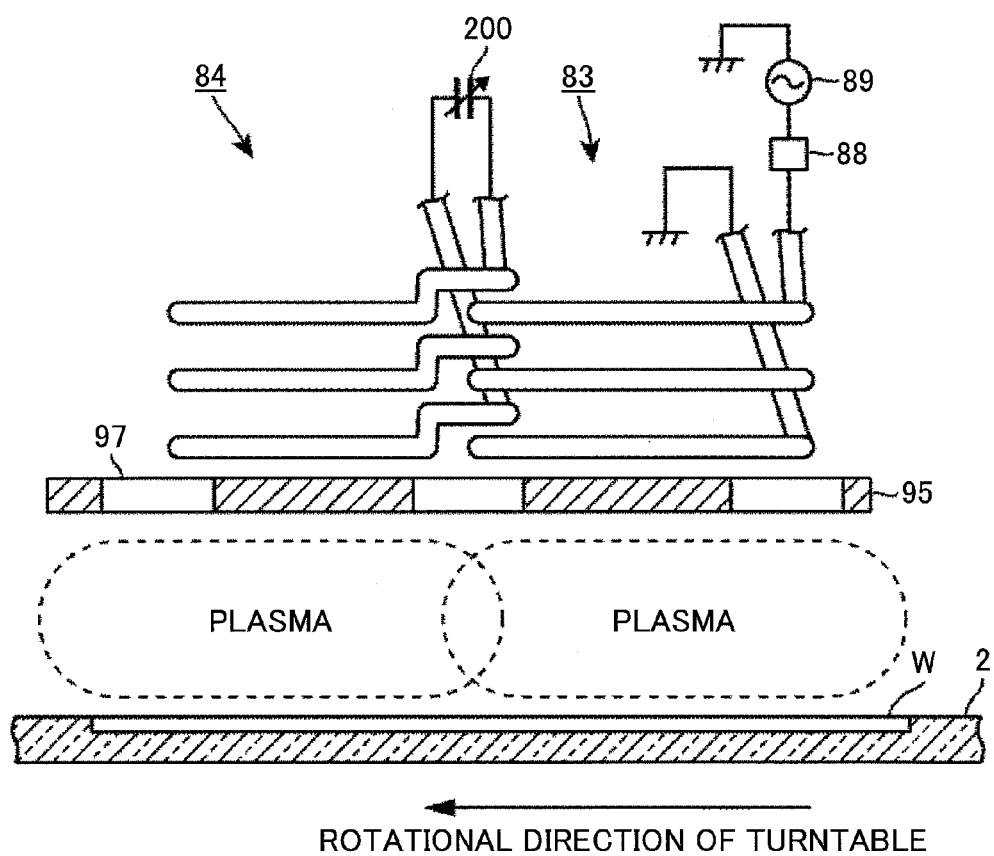
FIG. 11 is a vertical cross-sectional view illustrating another example of the plasma processing apparatus according to an embodiment of the present invention.

FIG. 11 illustrates an example in which the straight portions 85 on the upstream side in the rotational direction of the turntable 2 in the auxiliary antenna 84 are arranged at a position where the auxiliary antenna 84 overlaps with the straight portions 85 on the downstream side in the rotational direction of the turntable 2 in the main antenna 83 when seen in a plan view in generating the electromagnetic induction between the main antenna 83 and the auxiliary antenna 84. In other words, three of the straight portions 85 stacked in a vertical direction on the upstream side in the rotational direction of the turntable 2 in the auxiliary antenna 84 and three of the three straight portions 85 stacked in the vertical direction on the downstream side in the rotational direction of the turntable 2 in the main antenna 83 are alternately arranged in the vertical direction, respectively.

Accordingly, when projection areas of the main antenna 83 and the auxiliary antenna 84 when seen in a plan view are called a main projection area and an auxiliary projection area, respectively, the main projection area overlaps with a part of the auxiliary projection area, and a portion thereof on the upstream side in the rotational direction of the turntable 2 sticks out in FIG. 11. Furthermore, the auxiliary projection area overlaps with a part of the main projection area, and a portion thereof on the downstream side in the rotational direction of the turntable 2 sticks out. A portion in the auxiliary antenna 84 apart from the main antenna 83 on the downstream side in the rotational direction of the turntable 2 bends downward and comes close to the insulating member 94 (see also FIG. 5). The clearance h between the main antenna 83 and the auxiliary antenna 84 is set in a range described above in this example. Here, in FIG. 11, the depiction of the insulating member 94 is omitted.

Figure 12:
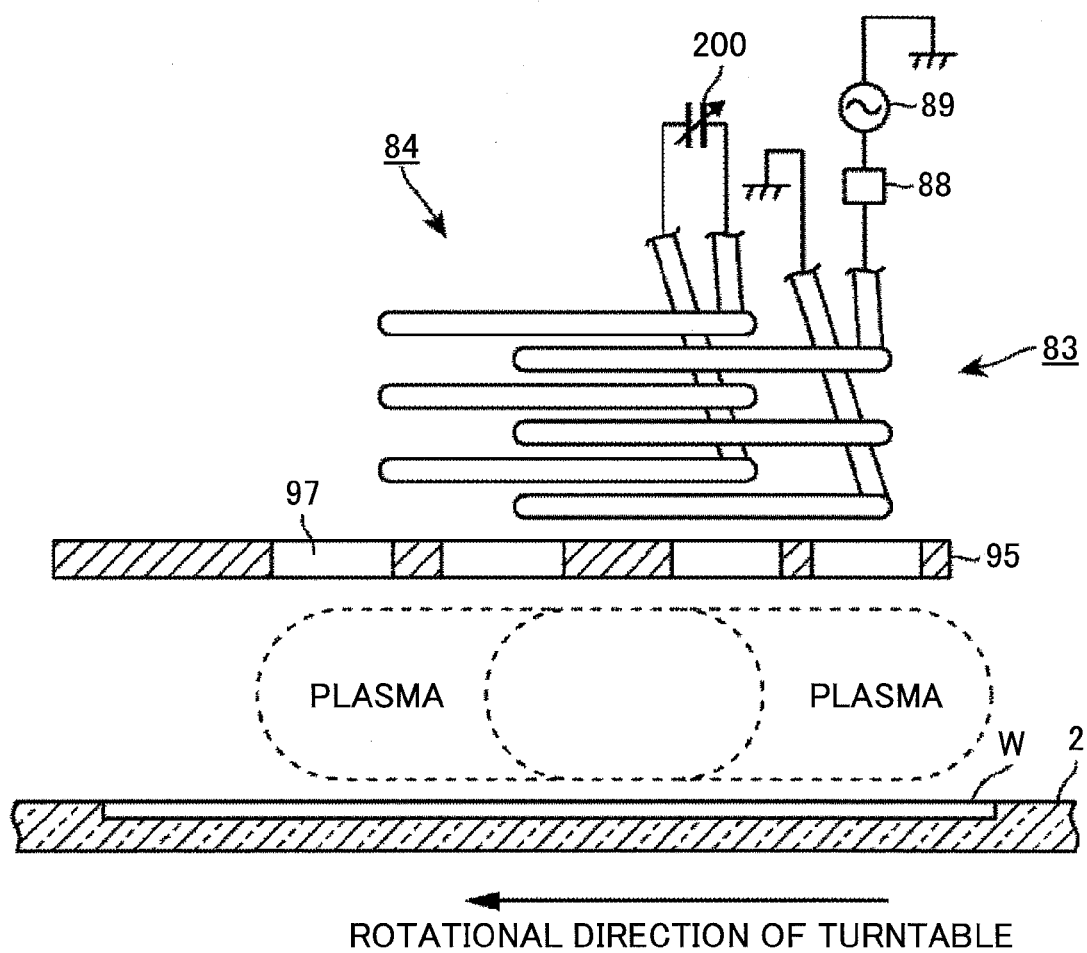
FIG. 12 is a vertical cross-sectional view illustrating another example of the plasma processing apparatus according to an embodiment of the present invention.

FIG. 12 illustrates an example of positioning the auxiliary antenna 83 on the further upstream side in the rotational direction of the turntable 2 compared to the example in FIG. 11. In other words, the straight portions 85 in the auxiliary antenna 83 on the upstream side in the rotational direction of the turntable 2 are located between two of the straight portions 85 in the main antenna 83. In addition, the clearance h is set within the same range as described above. Even in this example, the main projection area and the auxiliary projection area overlap with at least a part of the auxiliary projection area and the main projection area. In other words, according to the embodiment of the present invention, by arranging each of the main projection area and the auxiliary projection area in positions where the main projection area and the auxiliary projection area are not included in the other projection areas thereof, the plasma generation area can be more expanded than that in the case of providing only the main antenna 83.

Figure 13:
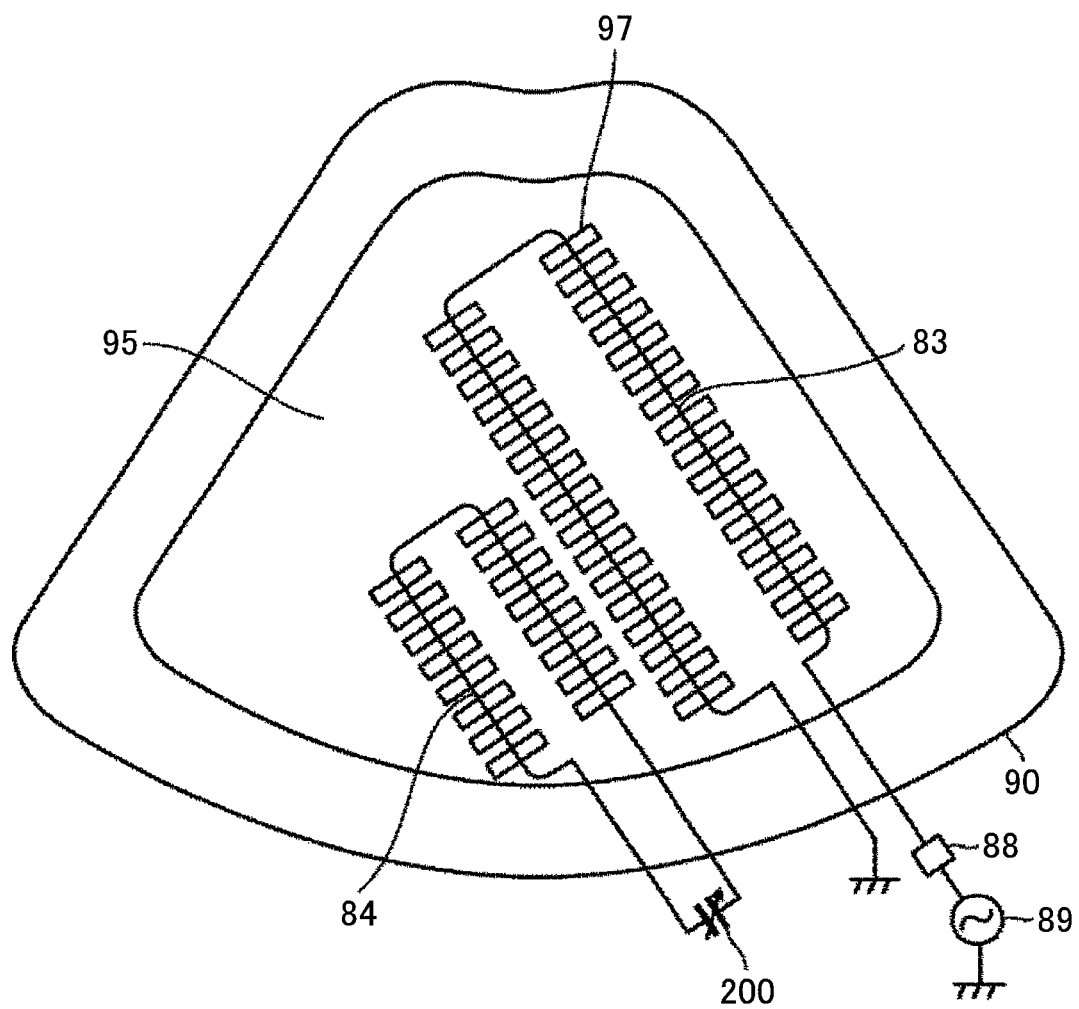
FIG. 13 is a vertical cross-sectional view illustrating another example of the plasma processing apparatus according to an embodiment of the present invention.
Figure 14:
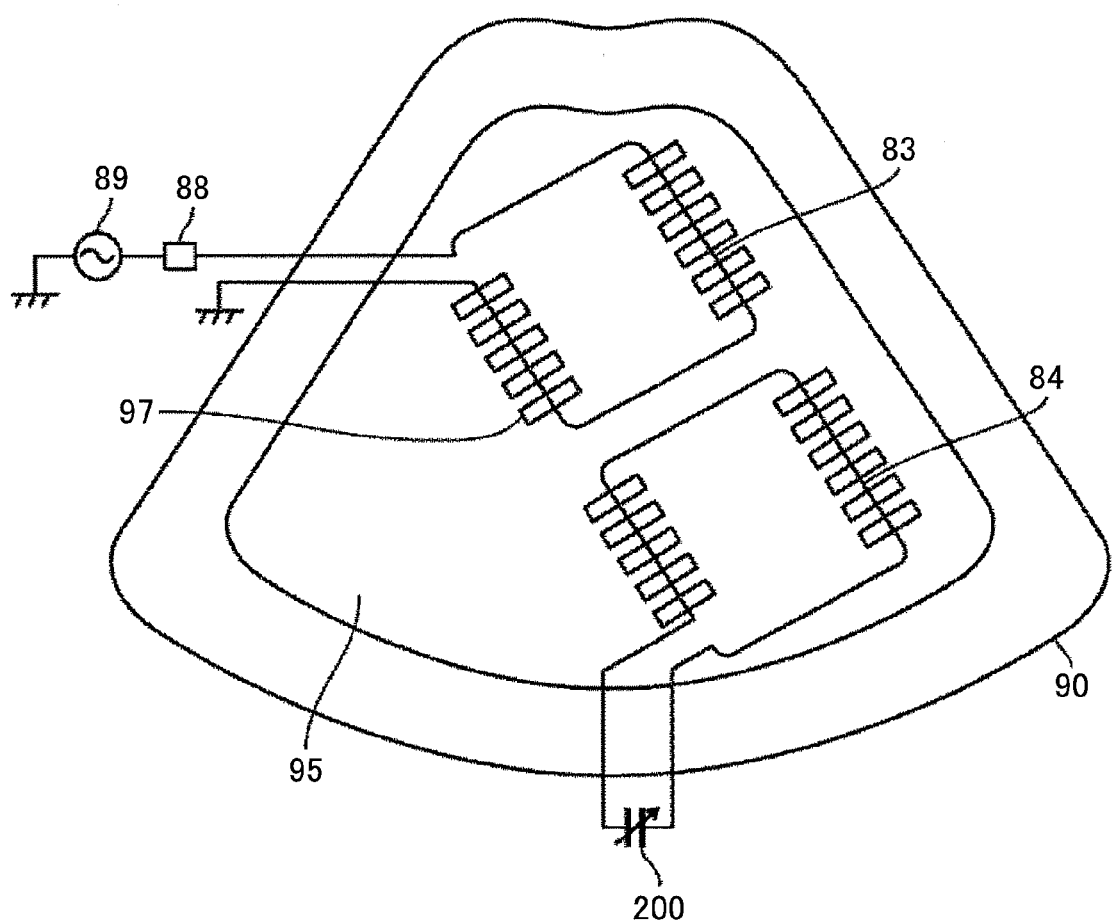
FIG. 14 is a vertical cross-sectional view illustrating another example of the plasma processing apparatus according to an embodiment of the present invention.
Figure 15:
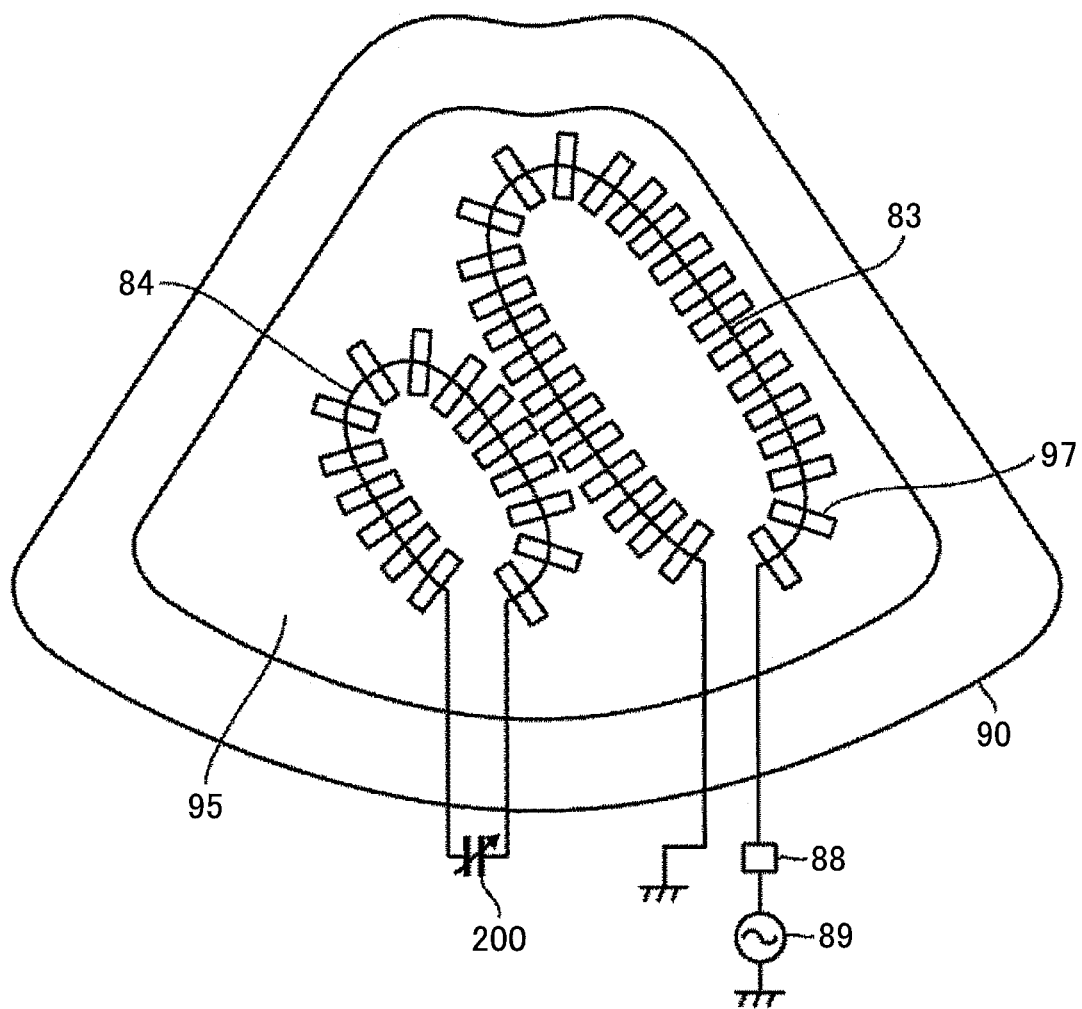
FIG. 15 is a vertical cross-sectional view illustrating another example of the plasma processing apparatus according to an embodiment of the present invention.

FIG. 13 illustrates an example of arranging the auxiliary antenna 84 at a position close to the outer edge of the turntable 2. By adopting such a layout, the plasma density in the area close to the outer edge can be made higher than that in an area on the central side of the turntable 2, and therefore the plasma density in the rotational direction of the turntable 2 can be adjusted. FIG. 14 illustrates an example of arranging the main antenna 83 and the auxiliary antenna 84 in the radial direction of the turntable 2. In this example, the main antenna 83 and the auxiliary antenna 84 are arranged on the rotational center side and the outer edge side of the turntable 2, respectively. By arranging the main antenna 83 and the auxiliary antenna 84 as illustrated in FIG. 14, respectively, an area generating plasma in the radial direction of the turntable 2 can be more expanded than that in the case of using the main antenna 83. Moreover, FIG. 15 illustrates an example of forming the antennas 83 and 84 into an elliptical shape, respectively, when seen in a plan view. Even in FIG. 15, the clearance h is set within the above-discussed range. Here, in FIGS. 13 through 15, the antennas 83 and 84 and the like are simplified.

A silicon oxide ($SiO_2$) film, a titanium nitride (TiN) film or the like may be deposited instead of the silicon nitride film as a type of deposition film deposited by using the above-described film deposition apparatus. When depositing the silicon oxide film, for example, at least one of oxygen ($O_2$) gas and ozone ($O_3$) gas is used as the plasma generating gas. When depositing the titanium nitride film, an organic gas and ammonia gas that contain titanium, respectively, are used as the adsorption gas and the plasma generating gas. Furthermore, the embodiment of the present invention may be also applied to the film deposition of the reaction product constituted of a nitride, an oxide or a hydroxide, in addition to the silicon oxide film and the titanium nitride film. Ammonia gas, oxide gas, hydrogen ($H_2$) gas and the like are taken as examples of the plasma generating gas used in depositing the nitride, oxide and hydroxide, respectively.

Moreover, by arranging the plasma generating gas nozzle 32, the casing 90 and the antennas 83 and 84 in a position on the downstream side in the rotational direction of the turntable 2 when seen from the adsorption area P1 and on the upstream side in the rotational direction of the turntable 2 when seen from the reaction area P2 (i.e., between the adsorption area P1 and the reaction area P2), another plasma process may be performed in the position. In this case, the additional plasma process may be a plasma modification process on the reaction product deposited on the wafer W performed by using argon (Ar) gas as the plasma generating gas. Furthermore, when performing such a plasma modification process, the plasma modification process may be performed each time a plurality of layers of the reaction product is deposited. In other words, the plasma modification process may be performed each time the turntable 2 rotates the plurality of times.

Here, as noted from the formulas discussed above, in generating the series resonance at the auxiliary antenna 84, an inductance L of the auxiliary antenna 84 or a frequency of the high frequency power source 89 may be adjusted instead of the capacitance value C of the auxiliary antenna 84 (capacitance value of the capacitance adjusting part 200), or with the capacitance value C. More specifically, in constructing the loop shaped inductor by connecting one end in the lengthwise direction of the auxiliary antenna 84 to the other end, by forming connecting points to connect the one end to the other end in a plurality of locations in the vicinity of the other end, the inductance L (i.e., length dimension of the auxiliary antenna 84) may be adjusted. Furthermore, a configuration capable of changing an output frequency f as the high frequency power source 89 may be used. Accordingly, an "impedance adjusting part" in the embodiment of the present invention means at least one of the capacitance variable capacitor capable of changing the capacitance value thereof, a variable inductor capable of changing an inductance value thereof and an oscillator capable of changing a frequency thereof. In addition, the capacitance value C of the auxiliary antenna 84 may be preliminarily adjusted to a value that resonates with the main antenna 83. In this case, the capacitor provided in the loop of the auxiliary antenna 84 equals a capacitive component of the auxiliary antenna 84.

WORKING EXAMPLES

Figure 16:
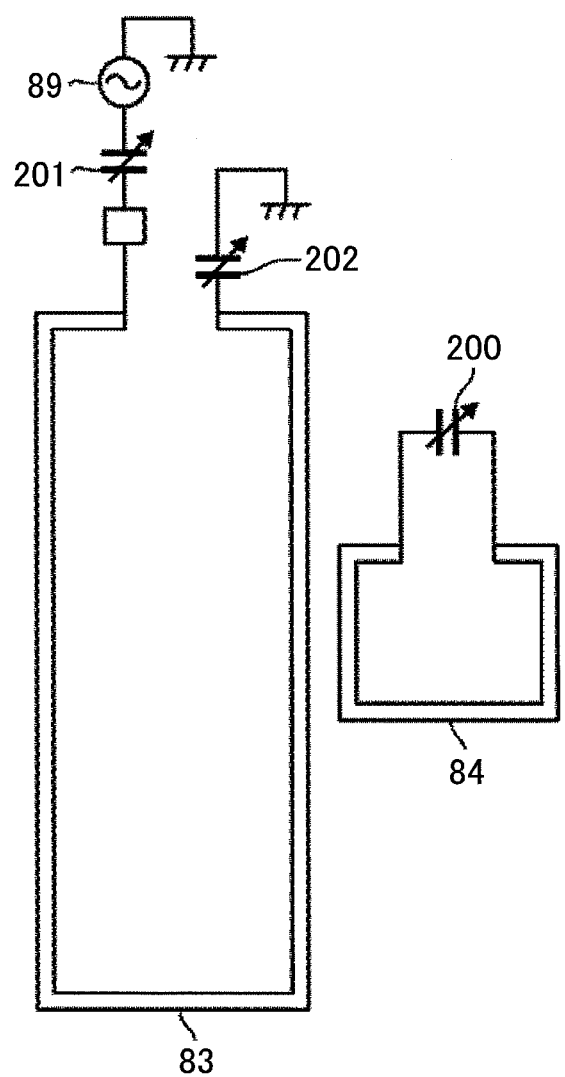
FIG. 16 is a plan view illustrating a layout arrangement of an antenna in a working example of the present invention.
Figure 17:
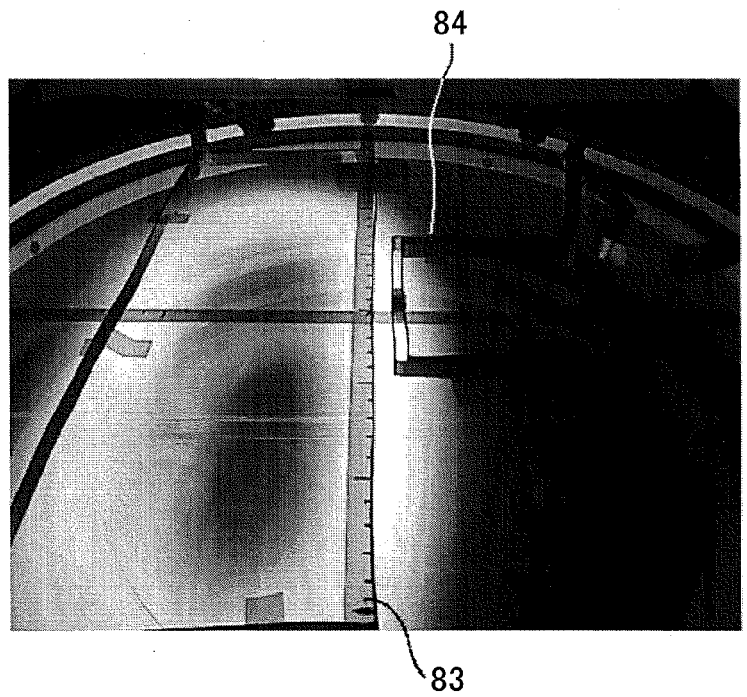
FIG. 17 is a characteristic diagram obtained by taking a photograph of a result of the working example of the present invention.

Subsequently, a description is given below of an experiment performed to confirm that plasma is generated under the antennas 83 and 84. As illustrated in FIG. 16, this experiment was performed by arranging a main antenna 83 formed to have an approximate rectangle when seen in a plan view and an auxiliary antenna 84 formed to have an approximate quadrangle at a position close to the main antenna 83 within an experimental chamber. In this example, in order to construct the main antenna 83 whose capacitance value is adjustable, a capacitance adjusting part 201 was arranged between an end in the lengthwise direction of the main antenna 83 and the high frequency power source 89, and a capacitance adjusting part 202 was also arranged between the other end of the auxiliary antenna 84 and the earth. In addition, the capacitance adjusting part 200 was arranged in the auxiliary antenna 84.

Then, the capacitance value of the capacitance adjusting part 200 in the auxiliary antenna 84 was varied as shown as experimental examples 1 through 4 in the following TABLE 1, and current values flowing through the antennas 83 and 84 were measured, respectively. Furthermore, plasma was generated in the chamber 1 under the conditions of each of the experimental examples 1 through 4, and light-emitting states thereof were shot. Here, a mixed gas of argon (Ar) and oxygen ($O_2$) was used as the plasma generating gas in this experiment.

TABLE 1

| | Experimental Example 1 | Experimental Example 2 | Experimental Example 3 | Experimental Example 4 |
|---|---|---|---|---|
| Capacitance Value (pF) of Capacitance Adjusting Part | 11 | 144 | 115 | 126 |
| Current Value (A) of Main Antenna on Power Source Side | 21.4 | 21.2 | 17.1 | 5.0 |
| Current Value (A) of Auxiliary Antenna | 0.5 | 13.6 | 14.9 | 29.3 |

Figure 18:
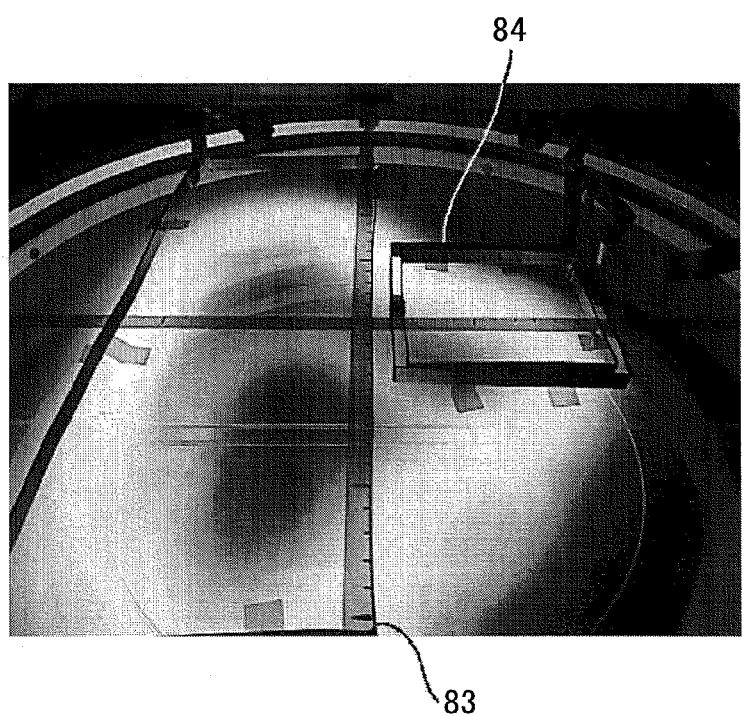
FIG. 18 is a characteristic diagram obtained by taking a photograph of a result of the working example of the present invention.
Figure 19:
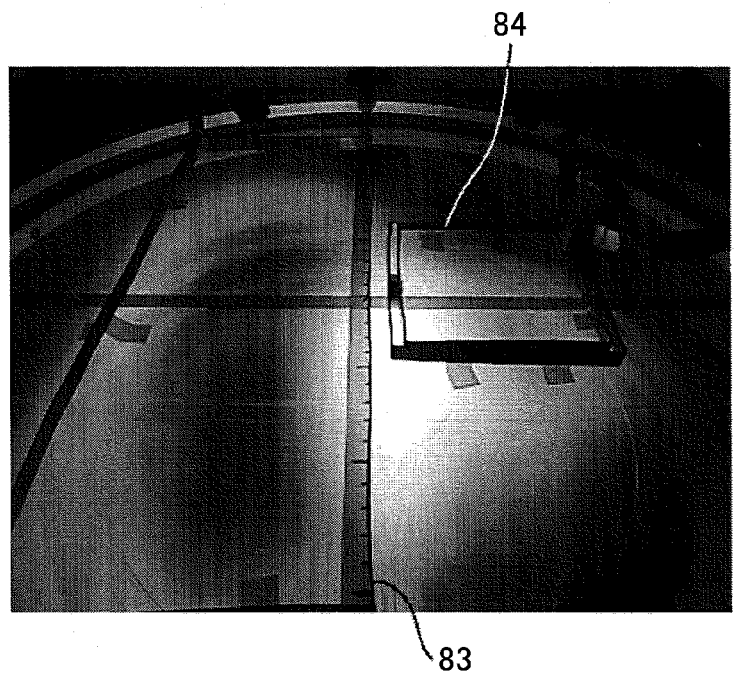
FIG. 19 is a characteristic diagram obtained by taking a photograph of a result of the working example of the present invention.
Figure 20:
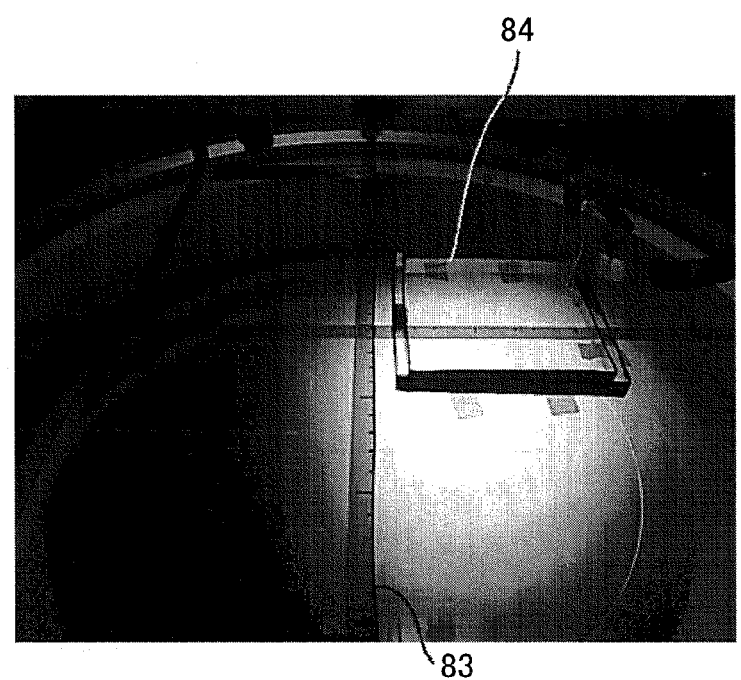
FIG. 20 is a characteristic diagram obtained by taking a photograph of a result of the working example of the present invention.

As a result, as shown in FIGS. 17 through 20, light-emitting distributions varied depending on the capacitance values of the capacitance adjusting part 200, and plasma generation areas (portions seen as white color in FIGS. 17 through 20) moved from an area under the main antenna 83 to an area under the auxiliary antenna 84. More specifically, in FIG. 17, plasma was mainly generated in a location under the main antenna 83. In FIG. 18, plasma was formed along the outer edge of the main antenna 83 and the auxiliary antenna 84 so as to cross the antennas 83 and 84. In FIG. 19, plasma was intensely generated in a position opposite to the antennas 83 and 84, and decreased in intensity with the increasing distance from the position and decreasing distance to the main antenna 83 and the auxiliary antenna 84. Moreover, in FIG. 20, plasma was mainly generated in an area under the auxiliary antenna 84.

In addition, as shown in TABLE 1 together, current values flowing through the main antenna 83 and the auxiliary antenna 84 varied in response to the light-emitting states of plasma in FIGS. 17 through 20. More specifically, the current values of the main antenna 83 decreased while the current values of the auxiliary antenna 84 increased changing from FIG. 17 through FIG. 20. From the above experimental results, as described above, expanding the plasma under the main antenna 83 so as to cross the area under the auxiliary antenna 84 was possible (see FIGS. 18 and 19). Furthermore, for example, when starting a film deposition process, if plasma is desired to be generated quickly, generating plasma having a local intensity in an area under the main antenna 83 is also possible (see FIG. 17).

Figure 21:
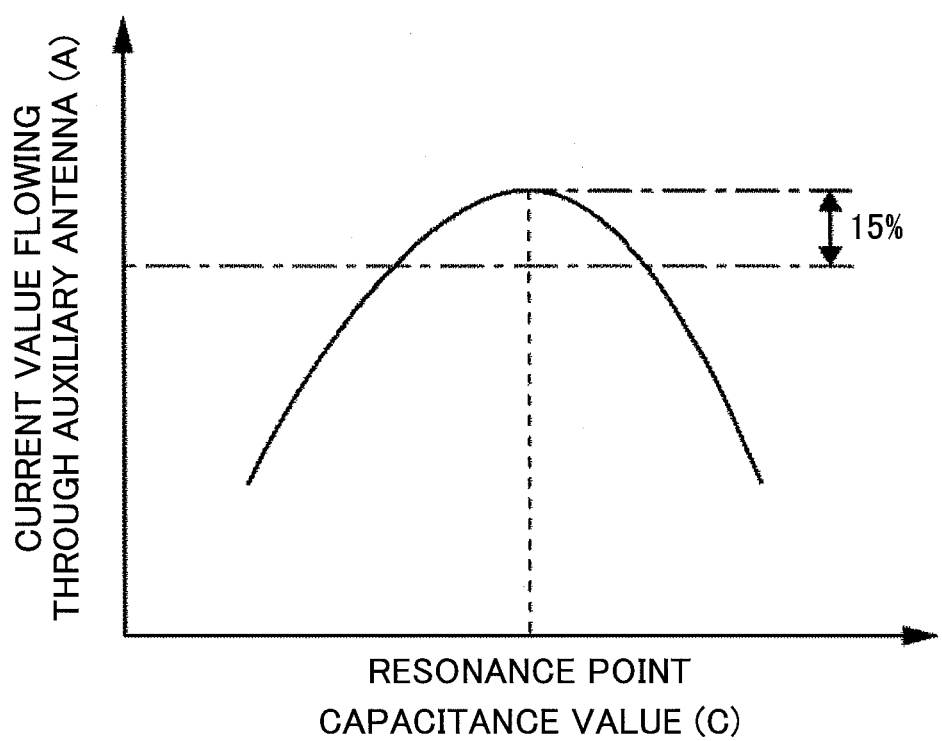
FIG. 21 is a characteristic diagram schematically illustrating a current value obtained by an auxiliary antenna of the present invention.

FIG. 21 shows a curve line schematically illustrating a relationship between the capacitance value of the capacitance adjusting part 200 and the high frequency current flowing through the auxiliary antenna 84 that are described above, and the horizontal axis and the vertical axis show the capacitance value and the high frequency current, respectively. This curve line is a concave facing down quadratic curve, and the current value flowing through the auxiliary antenna 84 becomes maximum when the capacitance value becomes a capacitance value that generates a series resonance of the auxiliary antenna 84 with the main antenna 83. As described above, in order to generate broad plasma from the main antenna 83 throughout the auxiliary antenna 84, the capacitance value of the capacitance adjusting part 200 is preferred to be set at a value that increases the current value flowing through the auxiliary antenna 84 as much as possible. More specifically, the capacitance value is preferred to be set at a value that can obtain a current value equal to or more than 85% of the current value that generates a series resonance between the antennas 83 and 84.

According to the embodiments of the present invention, in performing a plasma process on a substrate rotating on a turntable, a main antenna to which high frequency power is supplied and an auxiliary antenna electrically insulated from the main antenna is arranged. Moreover, the main antenna and the auxiliary antenna are arranged so that at least a part of projection areas of the main antenna and the auxiliary antenna do not overlap with each other. Then, induction plasma is generated even in the auxiliary antenna in addition to the main antenna by way of electromagnetic induction between the main antenna and the auxiliary antenna. Accordingly, because another high frequency power source is not required to be provided for the auxiliary antenna, a plasma generation area when seen in a plan view can be expanded while preventing an increase in costs of the apparatus.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A plasma processing apparatus configured to perform a plasma process on a substrate, the plasma processing apparatus comprising:
   a vacuum chamber;
   a turntable provided in the vacuum chamber and configured to rotate a substrate loading area to receive the substrate;
   a process gas supply part to supply a process gas to a substrate;
   a main antenna provided to face a passing area of the substrate and having a coiled shape configured to excite the process gas and to generate first induction coupled plasma when radio frequency power is supplied thereto;
   an auxiliary antenna having a coiled shape and kept electrically insulated from the main antenna at a position capable of causing electromagnetic induction with the main antenna, the auxiliary antenna being provided to include a portion that does not overlap with the main antenna when seen in a plan view and configured to excite the process gas and to generate second induction coupled plasma, wherein the auxiliary antenna is not connected to a power source;
   an impedance adjusting part capable of adjusting an impedance thereof and provided in a loop formed by the auxiliary antenna; and
   a Faraday shield that holds the main antenna and the auxiliary antenna thereon at a same level relative to the turntable and to allow a magnetic field generated by the main antenna and the auxiliary antenna to pass through the Faraday shield downward from the same level.

2. The plasma processing apparatus as claimed in claim 1, wherein the impedance adjusting part includes a capacitance variable capacitor capable of changing a capacitance value thereof.

3. The plasma processing apparatus as claimed in claim 1, wherein the impedance adjusting part is adjusted so as to provide a current equal to or more than 85% of a maximum value of the current obtained when the current flowing through the auxiliary antenna is changed by changing an impedance of the impedance adjusting part.

4. The plasma processing apparatus as claimed in claim 1, wherein the process gas is a gas to azotize or to oxidize a surface of the substrate.

5. The plasma processing apparatus as claimed in claim 4, wherein the process gas to azotize the surface of the substrate is a gas containing at least one of ammonia gas and nitrogen gas.

6. The plasma processing apparatus as claimed in claim 4, wherein the process gas to oxidize the surface of the substrate is a gas containing at least one of oxygen gas and ozone gas.

7. The plasma processing apparatus as claimed in claim 1, wherein the main antenna extends from a central side to an outer edge side to cross the passing area of the substrate, and
   the auxiliary antenna is arranged on a downstream side in a rotational direction of the turntable relative to the main antenna.

8. The plasma processing apparatus as claimed in claim 1, wherein an edge of the main antenna on the auxiliary antenna side and an edge of the auxiliary antenna on the main antenna side are provided apart from each other when seen in a plan view.

9. The plasma processing apparatus as claimed in claim 8, wherein a distance between the edge of the main antenna on the auxiliary antenna side and the edge of the auxiliary antenna on the main antenna side is in a range from 2 to 30 mm.

10. The plasma processing apparatus as claimed in claim 1, wherein the impedance adjusting part includes a variable inductor capable of changing an inductance value thereof.

11. The plasma processing apparatus as claimed in claim 1, wherein the impedance adjusting part includes an oscillator capable of changing a frequency thereof.

\* \* \* \* \*